United States Patent
Crouser et al.

(10) Patent No.: US 9,348,167 B2
(45) Date of Patent: May 24, 2016

(54) ENHANCED LIQUID CRYSTAL DISPLAY SYSTEM AND METHODS

(75) Inventors: Maria Emma Crouser, Portland, OR (US); Andrew Mitchell Robinson, Fairview, OR (US); Daniel R. Doyle, Medway, MA (US); Peter Richard Oehler, Aloha, OR (US); T. Scott Engle, Beaverton, OR (US)

(73) Assignee: VIA optronics GmbH, Schwarzenbruck (GB)

( * ) Notice: Subject to any disclaimer, the term of this patent is extended or adjusted under 35 U.S.C. 154(b) by 199 days.

(21) Appl. No.: 12/050,845

(22) Filed: Mar. 18, 2008

(65) Prior Publication Data

US 2008/0230177 A1 Sep. 25, 2008

Related U.S. Application Data

(60) Provisional application No. 60/918,974, filed on Mar. 19, 2007.

(51) Int. Cl.
*G02F 1/1335* (2006.01)
*H01L 51/52* (2006.01)
*G02F 1/1333* (2006.01)

(52) U.S. Cl.
CPC ...... *G02F 1/133502* (2013.01); *H01L 51/5246* (2013.01); *G02F 1/13338* (2013.01); *G02F 2001/133311* (2013.01); *G02F 2001/133331* (2013.01); *G02F 2201/50* (2013.01);
(Continued)

(58) Field of Classification Search
CPC .............. G02F 2001/133331; G02F 2202/025; G02F 2202/28; B23B 37/10; B23B 37/1018
USPC ........... 156/275, 329, 327, 326, 324.4, 273.3, 156/275.5, 331.1, 235, 240, 241, 248, 250, 156/257, 265, 268, 277, 280, 291, 295, 69
See application file for complete search history.

(56) References Cited

U.S. PATENT DOCUMENTS 2,765,251 A * 10/1956 Williams ............. 442/287
5,637,176 A * 6/1997 Gilleo ............. B29C 41/12
156/277
(Continued)

FOREIGN PATENT DOCUMENTS

JP H09274536 A 10/1997
JP H1096906 A 4/1998
(Continued)

OTHER PUBLICATIONS

Machine translation of JP2003295780.*
(Continued)

*Primary Examiner* — Christopher Schatz
(74) *Attorney, Agent, or Firm* — Alleman Hall McCoy Russell & Tuttle LLP

(57) ABSTRACT

Embodiments of methods and systems to generate an enhanced layered display system are described herein. In one embodiment, a method of generating an enhanced layered display system is provided including dispensing an optical bonding liquid onto a first substrate; forming an adhesive preform unit by curing the optical bonding liquid on the first substrate; and laminating the adhesive preform unit to a second substrate to form the enhanced layered display system, where one of the first substrate and the second substrate is a display.

10 Claims, 15 Drawing Sheets

(52) U.S. Cl.
CPC ..... *G02F2201/503* (2013.01); *G02F 2202/025* (2013.01); *G02F 2202/28* (2013.01); *Y10T 428/28* (2015.01); *Y10T 428/2852* (2015.01)

(56) References Cited

U.S. PATENT DOCUMENTS

| | | | |
|---|---|---|---|
| 5,793,461 A | | 8/1998 | Inou |
| 5,882,460 A | * | 3/1999 | Durand et al. ............... 156/166 |
| 5,969,847 A | | 10/1999 | Coleman et al. |
| 6,020,945 A | | 2/2000 | Sawai et al. |
| 6,040,378 A | | 3/2000 | Sanduja et al. |
| 6,168,851 B1 | | 1/2001 | Kubota |
| 6,181,394 B1 | | 1/2001 | Sanelle et al. |
| 6,246,459 B1 | | 6/2001 | Simhambhatla et al. |
| 6,340,404 B1 | * | 1/2002 | Oka et al. ..................... 156/230 |
| 6,356,376 B1 | | 3/2002 | Tonar |
| 6,428,650 B1 | * | 8/2002 | Chung ......................... 156/250 |
| 6,494,987 B1 | | 12/2002 | Yamaguchi et al. |
| 6,587,097 B1 | | 7/2003 | Aufderheide et al. |
| 6,646,076 B1 | | 11/2003 | Kendall et al. |
| 6,762,752 B2 | | 7/2004 | Perski et al. |
| 6,933,991 B2 | | 8/2005 | Sanelle et al. |
| 2001/0015258 A1 | * | 8/2001 | Hirai ............................ 156/329 |
| 2002/0031622 A1 | | 3/2002 | Ippel et al. |
| 2002/0033919 A1 | * | 3/2002 | Sanelle ............... G02F 1/13338 349/122 |
| 2002/0074086 A1 | * | 6/2002 | Nakamura et al. ........... 156/329 |
| 2002/0130849 A1 | * | 9/2002 | Ahn et al. .................... 345/173 |
| 2005/0007349 A1 | | 1/2005 | Vakil et al. |
| 2005/0083307 A1 | | 4/2005 | Aufderheide et al. |
| 2005/0212990 A1 | | 9/2005 | Robinder et al. |
| 2005/0237861 A1 | * | 10/2005 | Bell ............................. 368/223 |
| 2006/0057368 A1 | * | 3/2006 | Kobayashi et al. .......... 428/343 |
| 2006/0094834 A1 | * | 5/2006 | Aoki et al. ................... 525/478 |
| 2006/0202042 A1 | | 9/2006 | Chu |
| 2007/0020319 A1 | | 1/2007 | Bougherara |
| 2007/0034317 A1 | * | 2/2007 | Sklyarevich et al. ........ 156/106 |
| 2007/0057970 A1 | | 3/2007 | Vasilache |
| 2007/0062739 A1 | | 3/2007 | Philipp et al. |
| 2007/0070589 A1 | | 3/2007 | Chen et al. |
| 2007/0074316 A1 | | 3/2007 | Alden et al. |
| 2007/0240804 A1 | * | 10/2007 | Arai et al. ..................... 156/71 |
| 2007/0267135 A1 | * | 11/2007 | Kim et al. .................... 156/278 |
| 2008/0096655 A1 | * | 4/2008 | Rasmussen et al. ........... 463/31 |
| 2008/0261057 A1 | | 10/2008 | Slobodin |
| 2008/0266273 A1 | | 10/2008 | Slobodin et al. |

FOREIGN PATENT DOCUMENTS

| | | | |
|---|---|---|---|
| JP | 11254608 A | | 9/1999 |
| JP | 2001003020 A | | 1/2001 |
| JP | 2002006190 A | | 1/2002 |
| JP | 2003266597 A | | 9/2003 |
| JP | 2003295780 A | | 10/2003 |
| JP | 2006003676 A | * | 1/2006 |

OTHER PUBLICATIONS

ISA United States, International Search Report of PCT/US08/05365, Aug. 20, 2008, WIPO, 3 pages.

"CapSense," Cypress Perform, Cypress Semiconductor Corporation, www.cypress.com, Accessed Mar. 30, 2007, 7 pages.

Stetson, John W., "Analog Resistive Touch Panels and Sunlight Readability," Sunlight Readability, Information Display, Google Search: http://www.gunzeusa.com/files/pdf/ID_Gunze_Dec-21070-1.pdf, Dec. 2006, 5 pages.

ISA United States, International Search Report of PCT/US2008/03587, Jun. 25, 2008, WIPO.

U.S. Appl. No. 60/918,974, filed Mar. 19, 2007, Crouser et al.

ISA United States, International Search Report of PCT/US2008/05005, Jul. 15, 2008, WIPO.

ISA European Patent Office, Supplementary Search Report of EP08726970.0, Nov. 7, 2011, Munich, 7 pages.

Japanese Patent Office, Decision of Rejection of Japanese Patent Application No. JP2009-554558, Oct. 1, 2013, 4 pages.

Patent Office of Japan, Notice of Reasons for Rejection of Japanese Patent Application No. 2009554558, Mailed Mar. 19, 2013, Japan, 5 pages.

Japanese Patent Office, Translation of Notice of Reasons for Rejection of Japanese Patent Application No. JP2009554558, Mailed Sep. 18, 2012, Japan, 4 pages.

Taiwan Intellectual Property Office, Translation of the Preliminary Examination Report of Taiwanese Patent Application No. 97 109 599, May 20, 2013, Taiwan, 5 pages.

* cited by examiner

ENHANCED LIQUID CRYSTAL DISPLAY SYSTEM AND METHODS

CROSS-REFERENCE TO RELATED APPLICATION

The present application claims priority to U.S. Provisional Patent Application Ser. No. 60/918,974 of Maria Crouser and Scott Engle, entitled ENHANCED LIQUID CRYSTAL DISPLAY DEVICE filed Mar. 19, 2007, the disclosure of which is hereby incorporated by reference.

FIELD

The present application relates to systems, apparatus and methods for interfacing optical layers, and more particularly systems, apparatus and methods for enhancing a liquid crystal display device.

BACKGROUND

Display devices, such as liquid crystal displays (LCDs) or organic light emitting displays (OLEDs), are used in a variety of environments. Depending on the use environment and application of the display device, brightness and contrast features of the display device may be of significant value. For example, use of a display device in an outdoor environment or in an environment with high ambient light may require increased levels of contrast and/or brightness to maintain a desired level of viewability.

Typical LCDs comprise a liquid crystal display panel having a thin film of liquid crystals sandwiched between a pair of transparent electrodes. The liquid crystal display panel typically includes a pair of glass plates, the glass plates being sealed together around their respective edges. The glass plates may be assembled with spacers between them to maintain a constant separation distance. Two crossed axis polarizers may be adhered to the respective inside surfaces of the glass plates, one polarizer being adhered to the front of the liquid crystal display panel and the other polarizer being adhered to the rear of the liquid crystal display panel. When a voltage is applied selectively across the electrodes, the liquid crystal molecules between them may be rearranged or switched in polarization so that light is either transmitted or absorbed in the output polarizer to form characters or graphics.

LCDs may include a layer of indium tin oxide or another suitable material positioned between, or in front of, the front polarizer and the front glass plate for use as an electromagnetic interference shield. Some LCDs, intended for use in cold environments, also include a layer of indium tin oxide or another suitable material positioned between the rear polarizer and the rear glass plate and electrically connected to a power source for use as a heating element.

LCDs may be susceptible to back-reflected ambient light such that the viewing characteristics of the display deteriorate under high ambient light conditions, such as when placed in direct sunlight. Various methods have been used to improve the viewing characteristics of the LCDs. For example, in some embodiments, anti-reflection coatings have been applied to the front of the display. As another example, additional optical layering has been used to improve the viewing characteristics and to improve the durability of the displays.

It is known to add a transparent layer, also referred to herein as an overlay, to the outer face of an LCD as an interface between the display and the viewer. The overlay may be any suitable transparent material, including tempered glass or transparent plastic. Such an overlay may provide desired aesthetic features as well as functional features to the display. For example, some overlays may be used to create a smooth, transparent cover over the display, as in a cell phone, computer monitor or television. Further, some overlays may improve the robustness of a fragile LCD or OLED. The overlay may provide mechanical and/or environmental protection in displays which are stressed by their environments, including displays in public kiosks or ATMs, or in displays where a digitizer is used with a pen or stylus on the display and the overlay operates to protect the soft, polymeric top polarizer on the LCD or films and materials within the OLED. Moreover, the overlay may also be actively functional, providing a touch interface or EMI shielding.

Although the overlay improves the LCD, OLED or other display device, the addition of the overlay introduces two additional air-overlay interfaces. These air-overlay interfaces generate reflections and decrease the performance of the display in use. For example, typical optical glass and plastics have an index of refraction between 1.47 and 1.59, resulting in reflections in from 3.6% to 5.3% at normal incidence at each surface. This roughly 10% increase in reflectance from the display caused by the addition of the overlay may dramatically decrease the performance of the display in use. The degradation of performance of the display based on the additional air-overlay interfaces may be significantly more evident in bright ambient environments.

To reduce the impact of adding an overlay, prior systems have bonded the overlay to the display using an adhesive. The adhesive has been used to fill the gap between the bottom of the overlay and the top face of the display. Currently, there are two types of optical adhesive in use for bonding the display: form-in-place liquid adhesives and pressure sensitive adhesives (PSA) sheets.

Form-in-place liquid adhesives may be applied to either the front face of the display or the back surface of the overlay. The overlay or display is then positioned onto the adhesive while the adhesive is uncured. The display and overlay are held in place as the adhesive cures. In some cases, the adhesives are self curing. In other cases, UV light is used to initiate cure. However, the form-in-place liquid adhesives may have substantial limitations and may increase production costs of a completed display. For example, a long period of time is necessary to enable the form-in-place liquid adhesive to sufficiently cure. Further, accelerating curing may be difficult as the overlay and the display provide a barrier to any heat or light source used to accelerate curing.

PSA sheets include sheets with pressure sensitive adhesive where the adhesive forms a bond when pressure is applied. Although the PSA bonds may prevent some of the difficulties that arise in regards to the liquid form adhesives, the mechanical properties of the adhesive are driven by the roll-to-roll process that is used to create them. By necessity, the PSA sheets are harder and stiffer than desired for direct bonding applications. The requirements for using the PSA sheets result in direct transmission of force from the overlay to the fragile LCD surface during adhesive application, resulting in optical defects such as mura or even permanent cell damage. OLEDs are also susceptible to damage since the OLEDs typically incorporate a very thin glass substrate. Additionally, the increased surface hardness of the PSA systems increase susceptibility to latent processing defects when contaminants are present on the surface to be bonded. For example, the PSA will not conform to a surface contaminant and a delamination or bubble will form around the contaminant after bonding. PSA sheets are also limited to small thicknesses as they must be free standing. In many cases, the thicknesses which the PSA sheets can accommodate are insufficient to fill the gap between the top polarizer of an LCD and a bottom surface of an overlay. Most displays larger than 5.0" diagonal include a bezel surrounding the display to provide structure and rigidity to the display system. This bezel fixes the minimum thickness of the optical adhesive between the top polarizer and the overlay and is typically 0.5 mm to as much as 3.0 mm for large displays. The PSA sheets cannot accommodate such adhesive depth requirements.

The inventors herein have recognized that there exists a need for providing improved viewing characteristics for displays, such as LCDs and OLEDs and a need to improve current methods for applying an overlay. Thus, as described in the disclosure below and as illustrated in the example figures, the inventors have provided methods, processes, systems and apparatus for providing an improved display with an overlay, including methods, processes, systems and apparatus for bonding an overlay on an LCD, OLED or other display device.

SUMMARY

Accordingly, embodiments of methods and systems to generate an enhanced layered display system are described herein. In one embodiment, a method of generating an enhanced layered display system is provided including dispensing an optical bonding liquid onto a first substrate; forming an adhesive preform unit by curing the optical bonding liquid on the first substrate; and laminating the adhesive preform unit to a second substrate, wherein one of the first substrate and second substrate is a display to form the enhanced layered display system.

This summary is provided to introduce a selection of concepts in a simplified form that are further described below in the Detailed Description. This summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

It should be appreciated that the following description and corresponding figures provide exemplary embodiments and the methods, applications, processes, and apparatuses are not intended to be limited to such description and figures.

Figure 1:
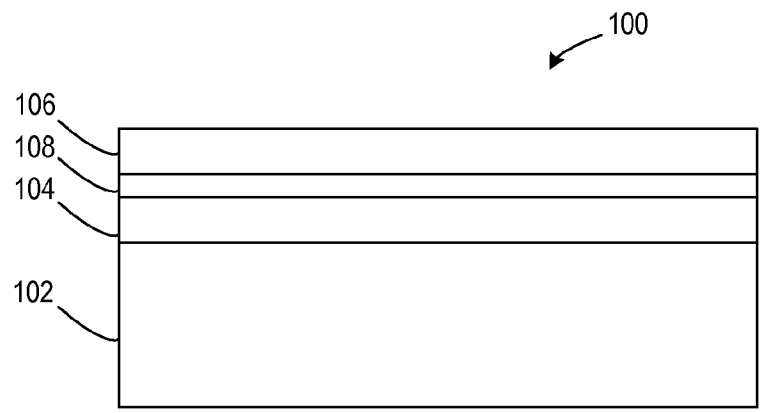
FIG. 1 provides a schematic illustration of an enhanced layered display system according to an embodiment of the present disclosure.

FIG. 1 provides a schematic illustration of an embodiment of an enhanced layered display system 100 according to an embodiment of the present disclosure. As used herein, an enhanced layered display may be any suitable display, such as LCD 102, in combination with at least one overlay, such as overlay 106. It should be appreciated that enhanced layered display system 100 may be a flat panel display, a cellular phone display, a monitor, a television display, a display for a personal data assistant or other portable computing device, outdoors displays, industrial displays, medical displays, navigational displays, or other electronic presentation, data, or graphic display. As such, although described for example purposes herein as the display being an LCD, it should be appreciated that the display may be any suitable display upon which an overlay may be applied, including, LCDs, organic light-emitting diode (OLEDS), electronic paper (e-paper) displays, surface-conduction electron-emitter displays (SED), light emitting diode (LED) displays, electroluminescent displays (ELDs), etc. Further, enhanced layered display system 100 may be an interactive display, such as a touch display, a light pen display, a graphics tablet, etc. As such, display system 100 may also be a substrate. For example, as a substrate, display system 100 may be a touch switch, glass, a filter, a vandal shield, etc.

In the illustrated embodiment, display system 100 may include LCD 102 where each pixel of the LCD generally includes a layer of liquid crystal disposed between two transparent electrodes, and two polarizing filters, the axes of polarity of which are perpendicular to each other. Selectively applying a voltage to the electrodes (and the resultant configuration change of the liquid crystals) enables control of whether light is either transmitted or absorbed such that images may be formed on the display. Additional information regarding LCDs may be found in U.S. Pat. No. 6,933,991 entitled Super Bright Low Reflectance liquid Crystal Display issued Aug. 23, 2005 and U.S. Pat. No. 6,181,394 entitled Super Bright Low Reflectance Liquid Crystal Display issued Jan. 30, 2001, both of which are hereby incorporated by reference for all purposes.

It is noted that the LCDs shown in the exemplary figures are illustrated schematically and the specific liquid crystal layers, polarizers, etc. are not shown in detail. The present disclosure is directed to the outside interface of the LCD such that an overlay 106 in the form of an optical layer (and/or protective layer) may be coupled to the external surface of the LCD. However, although the disclosure is directed to the bonding of the overlay to the LCD, it should be understood that the disclosed layering techniques herein, can be applied to other layers of an LCD or even to other optical devices having two or more layers. As such, as illustrated in FIG. 1, the LCD 102 includes a first or external facing substrate 104, such as a glass substrate, which is disposed on the exterior surface or face of the LCD 102. In some embodiments, first substrate 104 may be the polarizer of the LCD.

A second substrate or overlay 106 may be applied to the first substrate 104 to provide enhanced layered display system 100. The inside surface of overlay 106 is positioned to face the exterior surface of LCD 102, such as substrate 104. The second substrate 106 may be any suitable material and may have an index of refraction similar to the index of refraction of the first substrate, although this matching is not required in all embodiments. It should be appreciated that the substrates may be any suitable materials, and need not be the same material, including but not limited to glass, plastic, etc.

Disposed between first substrate 104 and second substrate 106 may be an optical bonding layer 108 composed of a bonding material. This bonding material may be a solid, gel or liquid. Typically, optical bonding layer 108 is an index-matched material such that the indices of refraction are substantially similar to one of the first substrate 104, the second substrate 106 or both. As one example, and not as a limitation, the first substrate may be glass and have an index of refraction of 1.472 such that the bonding layer has an index of refraction of 1.406.

In some embodiments, the bonding material of optical bonding layer 108 may be an optical adhesive. Although primarily described as an optical adhesive, in some embodiments, it should be appreciated that the bonding material may have little or no adhesion qualities and may be primarily an optically matched layer. In such non-adhesion embodiments, the layers may be held together via alternative means.

As described in more detail below, the bonding material may be a combination adhesive which is considered in application as a pre-cured optical adhesive. First, the bonding material may be applied as a liquid adhesive, also referred to herein as an optical bonding liquid, to one or both of the first substrate 102 and second substrate 106. The bonding liquid may be fully or substantially cured to form an adhesive pre-form, and following curing, the second substrate may be laminated onto the display. The bonded enhanced layered display system 100 may be post-processed to increase the adhesion strength of the bond and drive any entrapped air from the optical bond.

As an example and not as a limitation, the bonding material may be a silicon-based bonding material. Alternatively, the bonding material may be other suitable materials, including, but not limited to, urethane derivative materials and/or acrylic derivative materials. In some embodiments, the bonding material may be a mixture of a urethane derivative and a silicone derivative (and/or acrylic derivative). The mixture of the harder urethane-derivative with the softer silicone-derivative may provide additional bonding characteristics. As another example, in some embodiments, bonding to glass may be with a urethane-derivative, and/or bonding to the display may be with a silicone-derivative. Further, in some embodiments, it may be possible to use an epoxy derivative.

As further examples, and not as limitations, the following specific materials are provided as illustrative example materials and may be used alone or in combination. Options for bonding materials, include gels, elastomers and resins, including but not limited to, a mixture of dimethyl-siloxane and vinyl terminated dimethyl polymer with a hydrosilane crosslinking agent, a mixture of dimethyvinylsilioxy-terminated phenylmethyl cyclosiloxanes, methylvinyl siloxane, dimethoxy(glycidoxypropyl)-terminated, and/or polyether based aliphatic polyurethane.

In other embodiments, a multi-layer approach may include use of acrylic optically clear materials. Further a thinner may be applied to decrease the viscosity to the bonding material and assist in lamination. A material with a drying rate similar to acetone may be used such as hexamethyldisiloxane to achieve these effects.

Figure 2:
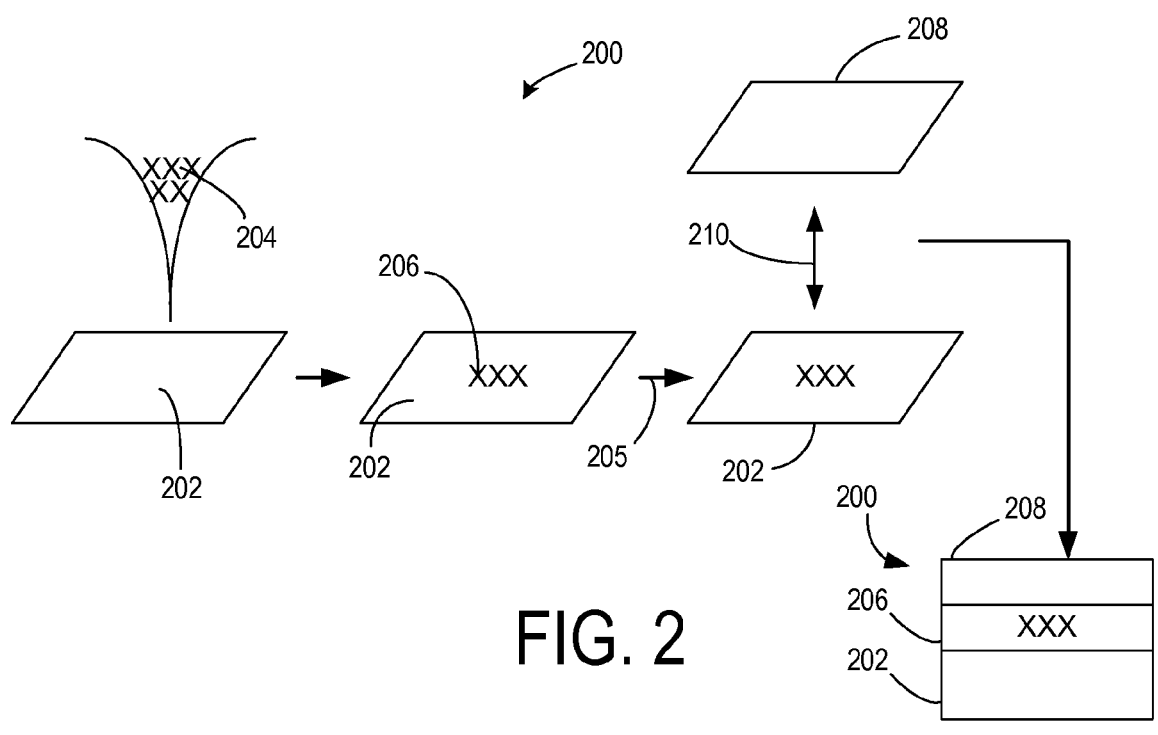
FIG. 2 illustrates a process for providing an optical layer for a display system according to an embodiment of the present disclosure.

FIG. 2 provides a schematic illustration of a laminating pre-cured optical adhesive process 200 for providing the display system of FIG. 1. As illustrated, an adhesive may be applied and cured to a single substrate prior to coupling the first and second substrate together. It is noted that substrate 202 is illustrated in FIG. 2 as the overlay, although it should be appreciated that in some embodiments, the display, such as an LCD display, may be considered as the first substrate.

Bonding material 204 may be applied to the surface of substrate 202. For example, bonding material 204 may be an optical bonding liquid. In some embodiments, the bonding material may be a pressure sensitive adhesive in a liquid carrier. The bonding material may be poured and leveled on the first substrate. This initial step may be considered the self-leveling step. In other embodiments, the bonding material 204 may be prepared on a separate surface or liner and then removed for application to the first and second substrate. Formation of the bonding layer using a liner may create a bonding sheet which may be used as described in more detail below.

Referring back to FIG. 2, prior to coupling the first and second substrates, bonding material 204 may be cured as indicated at 205. In some embodiments, after curing, the bonding material 204 may be cut to size, if necessary. In some embodiments, a double cure system may be used where the bonding material is cured at ambient temperature and then with heat or autoclaved. The resulting bonding material forms the bonding layer. In some embodiments, the bonding layer is of a minimum thickness of 0.004 inches. The depth of the bonding layer may be based, in part, on generating a uniform surface which accommodates variances in the substrate surfaces. It should be appreciated that the bonding material may be selected based on a plurality of factors, including but not limited to: optical qualities, such as the index of refraction of the material, and mechanical qualities, including bonding characteristics and curing speed. Materials that cure too quickly may be difficult to set in the layered complex. Further, materials that cure too slowly may result in increased production time and costs.

Following curing, substrate 202 may be considered to have a prepared surface 206 with cured bonding material, also referred to as the adhesive preform 206. A second substrate 208 may be applied as indicated by arrow 210 to the prepared surface 206 of substrate 202 to create a layered display system 212. It is noted that in some embodiments, the bonding material may be cured (either at ambient temperature or through heat/pressure) prior to coupling of the first and second substrate and the entire complex may be autoclaved again following the coupling of the first and second substrate to the bonding material.

The above process of preforming the bonding layer may reduce defects in the bonding layer. Further, the formed layer is substantially more uniform than conventional layers and may be uniform within 0.001 inch thickness.

The laminating pre-cured optical adhesive process shown in FIG. 2 allows the speed and simplicity of the PSA lamination process to form the optical bond between the display and overlay, while offering the desirable properties of the form-in-place liquid adhesives. Further, this pre-form lamination process enables the bonding layer to be much thicker than available with PSA sheets. This increased thickness allows the incorporation of optical bonding in customized and specialty displays, such as displays with perimeter bezels, which protrude from the front surface of the display. Additionally, the added thickness may be advantageous in interactive systems. For example, the additional thickness which can be created using the laminating pre-cured optical adhesive process, described above, may reduce stress placed on the display from touch pressure placed on the overlay in a touch or stylet display system.

It is further noted that in contrast to prior systems where the bonding material may be applied and then cured such that the first and second substrate are bonded together, application and curing of the bonding material to a single side of one of the substrates reduces the costs associated with defective sets. For example, with prior processes, a defect in the curing process resulted in both the first and substrate being in a compromised bonded state. To correct the defect in the bonding, either the entire unit (the first and second substrate and the adhesive) was discarded or efforts were performed to try to release the first and second substrate from each other. Efforts to release the first and second substrate typically result in destruction of at least one of the first and second substrate. In contrast, with application and curing of the bonding material on a single substrate, defects in the curing process may be identified prior to applying the second substrate. As the substrates may be coupled to additional layers (such as to the LCD panel), it is possible to control which substrate would be discarded upon detection of a defect. Since typically the overlay is less expensive than the LCD, defect identification prior to coupling of the LCD may result in preventing destruction or loss of LCDs during manufacture.

The laminating pre-cured optical adhesive method and resulting apparatus may have enhanced viewing characteristics, such as brightness, through the addition of the optical layer coupling. Further, the optical layer coupling may result in improved ruggedness with reduction in defective product production.

Figure 3:
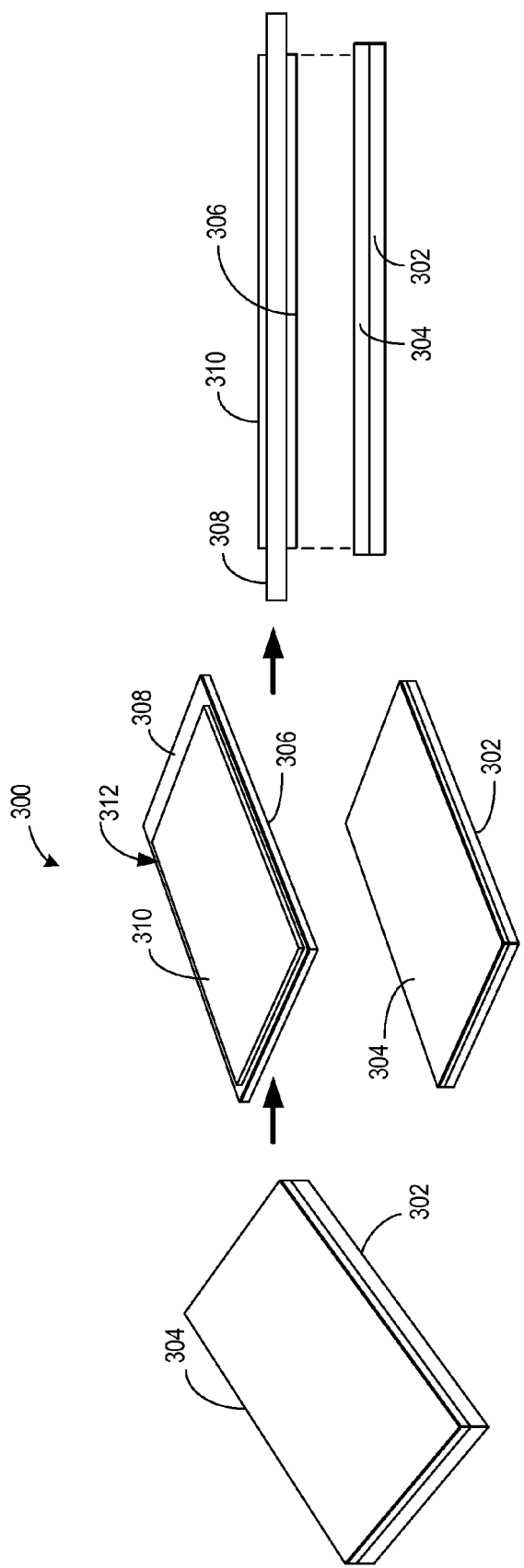
FIG. 3 illustrates a method of laminating an adhesive preform unit to create an enhanced layered display system.

FIG. 3 provides another illustration of a method 300 of laminating the adhesive preform to create an enhanced layered display system. Optical bonding liquid or material may be applied to the substrate 302 directly. The bonding material may be any suitable bonding material as described above. As a further example, and not as a limitation, the bonding material may be a two-part platinum cured silicone adhesive with added adhesion promoters. The bonding material, as used in these examples, is tacky in the fully cured state.

The desired bond-line thickness may be generated as the bonding material is applied to the substrate. Once the desired bond-line thickness is formed, the bonding material may be cured using a suitable curing system, including, but not limited to self-curing, light curing, such as UV or IR curing, heat curing, pressure curing, chemical curing, etc. The type of curing may be based on the formulation of the bonding material. As an example, self-curing adhesives may increase their cure rate by raising the temperature, which can be used to increase throughput. In the example of UV-initiated adhesive cures, the adhesive layer can be fully exposed directly to a light source. The ability to directly expose the adhesive layer facilitates improved curing in contrast to prior systems where shadowing may affect the curing process. Specifically, in traditional form-in-place liquid bonding, the overlay prevents the light source from directly penetrating the adhesive (the overlay is between the adhesive and the light source) and the overlay may negatively affect the light-initiated cure.

As shown in FIG. 3, the bonding material can be placed directly onto the overlay individually. In some embodiments, the bonding material may completely or substantially cover the overlay, such as when the display has no bezel and the overlay is the same or smaller size than the display glass, or when the overlay would fit entirely within the bezel of the display. In other embodiments, the bonding material may not cover the entire overlay, instead the bonding material may be specially shaped to match to the display. As an example, a shaped preform may be used when the overlay extends over the bezel of the display, or even overhangs the display.

Figure 4:
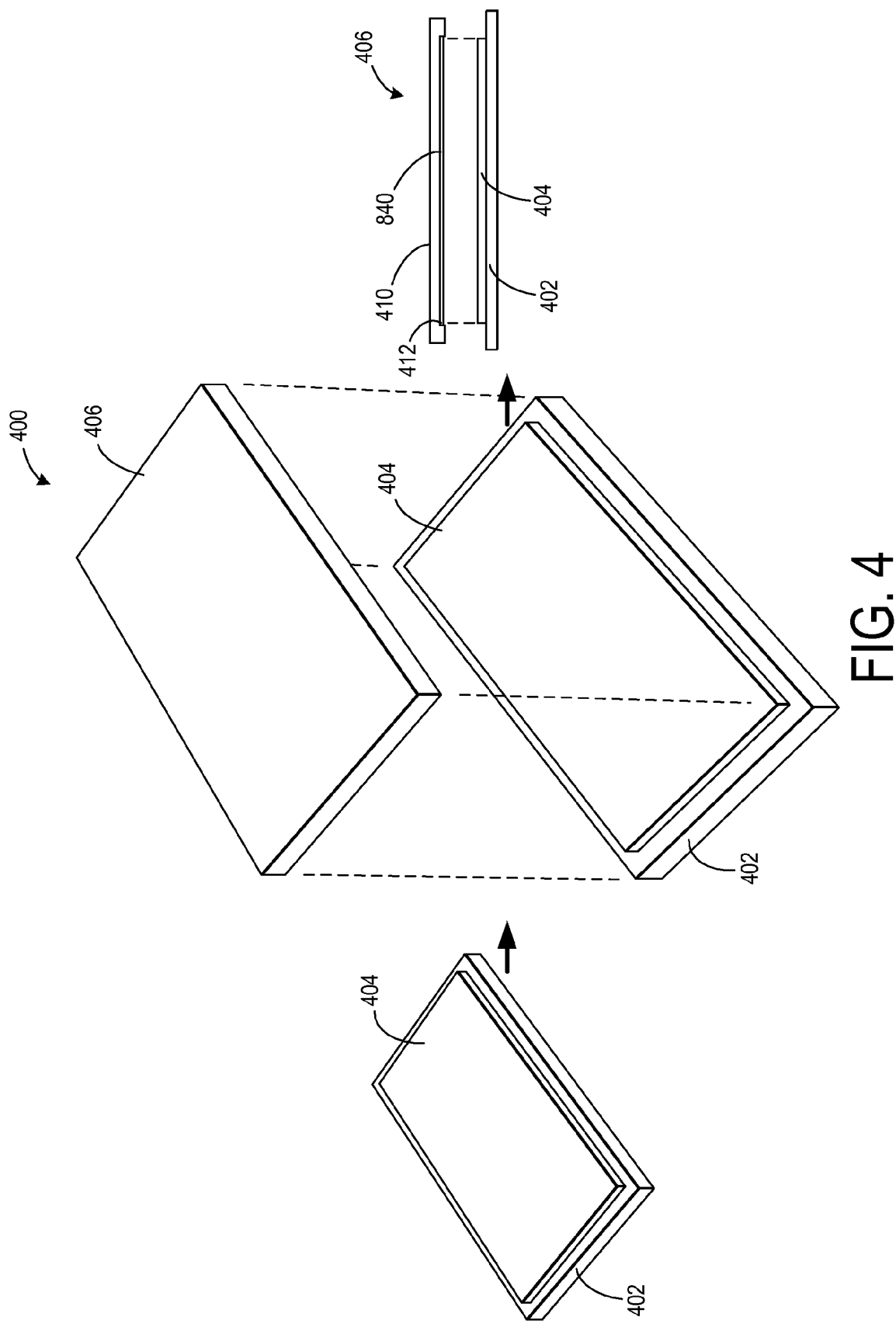
FIG. 4 illustrates another method of laminating an adhesive preform unit to create an enhanced layered display system.

As described above, following curing, substrate 302 may be considered to have a prepared surface with cured bonding material, also referred to as the adhesive preform. FIG. 3 illustrates an edge-to-edge preform 304 on substrate 302. FIG. 4 illustrates a shaped preform 404 on substrate 402.

As shown in FIG. 3, the edge-to-edge preform 304 corresponds to the top polarizer 306 of LCD 312. The overlay substrate and the tope polarizer are substantially the same size. The LCD layers 308 and bottom polarizer 310 complete the enhanced layered display system.

As shown in FIG. 4, the shaped preform 404 is selectively sized on the overlay 402. In some embodiments, the size of shaped preform 404 may correspond to features on the display 406, such as the size of an opening in the bezel of the display. As an example illustration, in FIG. 4, the shaped perform 404 is substantially sized to correspond to the bezel opening 412 in bezel 410. It is noted that the shaped preform in FIG. 4 is substantially the same size as top polarizer 408. It should be appreciated that not all systems will include a top polarizer and/or the top polarizer may be a different size than the shaped preform.

In positioning the bonding material, a substantially uniform thickness bond-line is desired. To prepare a substantially uniform thickness bond-line, in some embodiments, the overlay may be positioned in an adhesive pool, where the adhesive is then applied to the overlay to generate a substantially uniform thickness bondline. It should be appreciated that the thickness of the bond line can be such to accommodate any suitable display. For example, the bond line depth may be such to accommodate displays larger than 5.0" diagonal, where the minimum thickness of the optical adhesive between the top polarizer and the overlay is typically 0.5 mm to as much as 3.0 mm.

Figure 5:
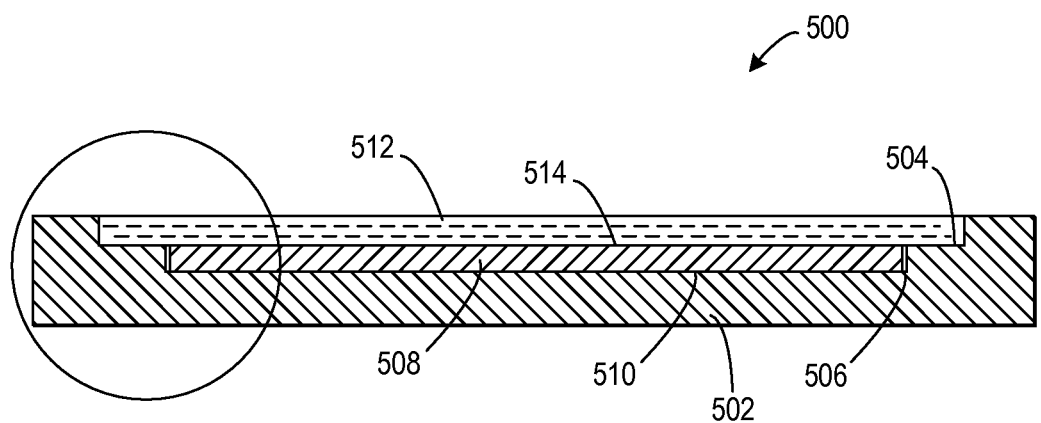
FIG. 5 illustrates an adhesive pool to create an adhesive preform unit.

FIG. 5 illustrates an embodiment showing use of an adhesive pool to generate a substantially uniform thickness bond-line. As illustrated, an adhesive pool 500 may be provided with a frame 502 and at least two depth levels, level one indicated at 504 and level 2 indicated at 506. In some embodiments, additional levels may be provided to accommodate different sized overlays and the two level system is shown for the purpose of example.

The pool may be configured to define an opening or cavity to receive the overlay 508. The overlay may be supported on overlay supports 510, such as the floor of level 2, in the adhesive pool. After positioning the overlay on the overlay supports 510 the pool may be filled with the bonding material 512. Typically, the adhesive pool must be substantially free of leaks which would result in depressions in the bond-line.

The overlay supports 510 ensure that the overlay 508 is in a level non-sloped orientation in order to prevent variation in the bonding material on the overlay when the bonding material is inserted into the adhesive pool. For example, in the illustrated embodiment, the floor of the pool is depressed to create level 2, indicated at 506, such that the depression in the floor corresponds to the shape of the overlay. The overlay may be inset into the depression, where the overlay supports 510 maintain the overlay 508 in substantially planar orientation. In the example embodiment, overlay 508 is supported such that level 1 of the pool, indicated at 504, is substantially co-planar with the top surface 514 of overlay 508. The coplanar leveling of the overlay with the bottom of the pool may operate to prevent a change in adhesive thickness at the edge of the overlay.

Although described in regards to creating a planar overlay, it should be appreciated that in some embodiments, a non-planar overlay may be used. Although the overlay may be non-planar, it may be possible to use the above-described methods to generate the desired adhesive preform on such an overlay. For example, the overlay may be spherical-shaped or another specialty shaped overlay. Further, although illustrated with rectangular overlays, the overlays themselves may be custom-shaped for a desired application. For example, the overlays may be non-rectangular overlays, where the overlay may be trapezoidal, circular, oval, star-shaped, or other custom shape. The adhesive preform may be similarly-shaped to the overlay depending on the application. In other embodiments, the adhesive preform may be shaped to correspond to the shape of the display. The shaping of the overlay and the display are customized features which can be incorporated into a select layered system.

It is noted that the adhesive pool may further include features to reduce non-uniformity of the bonding material to the edges of the overlay. As such, the overlay is positioned within level 2, where there is sufficient area extending beyond the edges of the overlay as indicated by level 1 at 504. If the edges of the pool are engaged against the edge of the overlay, there are edge effects on the adhesive where it meets the edge of the pool. For example, the surface tension of a liquid adhesive may result in formation of a meniscus at the edge interface. By controlling the meniscus, a flat, uniform bond-line may be along the overlay. By providing an extended-edge area, any such edge effects are substantially removed from the edge of the overlay by forming a larger area adhesive pre-form beyond the perimeter of the overlay. In other words, the "edge effect zone" is pushed outwards away from where the bond will be completed against the overlay. As an example, in some embodiments, 2 mm spacing is provided between the outer edge of the overlay and the outer edge of the pool frame. In such embodiments, once the adhesive has cured, the overlay may be removed from the pool and the excess preform is carefully cleaned from the edges of the overlay and also cleaned from the pool. It should be appreciated that other methods, including use of materials, adhesive pool shape design and environmental conditions may be used to control the meniscus and other edge effects.

Although described above in regards to an adhesive pool that utilizes an oversized preform, other adhesive pools may be used, including pools which create a substantially-identically sized preform. For example, the tiered design may be eliminated, such that the overlay may be positioned at the bottom of a straight walled pool. Such pools reduce the use of bonding material as little or no bonding material is wasted on the sides beyond the overlay. The reduction in bonding material may reduce the costs associated with the bonding material. Further, cleaning steps may be reduced with such pools.

Figure 6:
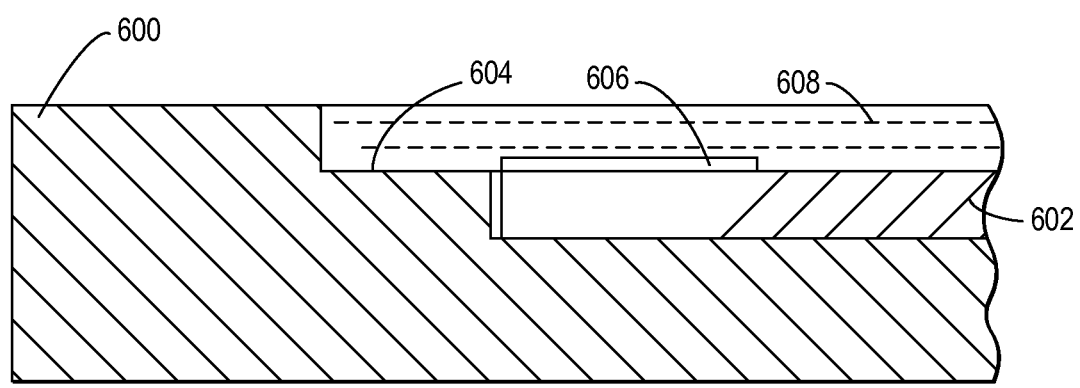
FIG. 6 illustrates an enlarged sectional view of an adhesive pool to create an adhesive preform unit.

It is noted that specialty preform shapes may be desired. As such, a masking layer may be included prior to insertion of the bonding material in the pool. For example, as shown in FIG. 6, an overlay 602 may be positioned in an adhesive pool 600. As described above the top layer of the overlay 602 may be substantially coplanar with level 1 edge 604. Overlay 602 may be masked as indicated at 606 such that when bonding material 608 is deposited into pool 600, the bonding material adheres to the masked portion of the overlay and is removed with the mask as it is pulled away.

It is noted that the overlay may be preprinted or preprocessed prior to application of the adhesive to create specialty or custom overlays. As an example, preprinting or preprocessing may be used for masking, for aesthetic applications, for functional purposes, such as touch screens, etc. Such preprinting and preprocessing may be understood to be features of the overlay. For example, portions of the overlay may be darkened, tinted, colored, or pre-printed with various graphics, wording, shadings, etc. The methods and systems herein enable such features to be accommodated without significant increase in processing. As one example, a preprocessed sheet may have holes or other features included in the glass overlay. The holes may be for mounting, speakers, touch sensors, etc. Additional printing may be included on the overlay to enable various functionalities or maintain a desired aesthetic of the display. For example, design printing or logos may be provided on the overlay.

Figure 7:
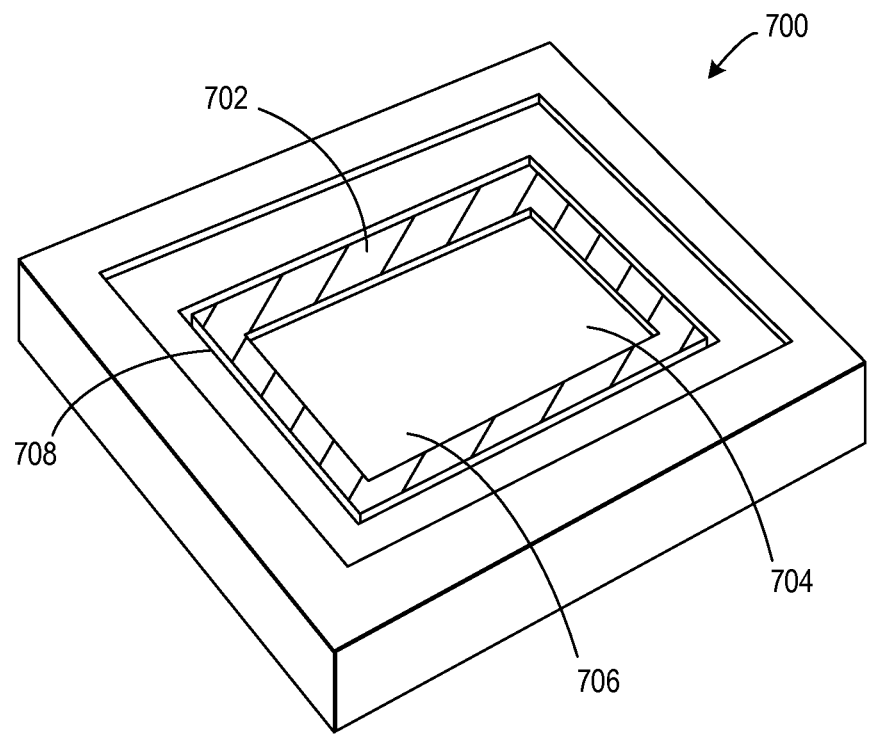
FIG. 7 shows a perspective view of an adhesive pool to create an adhesive preform unit.

FIG. 7 shows a perspective view of an adhesive pool 700 with an overlay 702 positioned within the depression formed by level 2, as indicated at 704. The floor of level 1, indicated at 706, is substantially coplanar with the top surface of overlay 702. Masking 708 extends around the perimeter of overlay 702 to form a specialty-shaped preform. Such masking may enable a shaped preform to be generated for use in aesthetically varied designs. Although shown in the shape of a uniform rectangle, other shapes and variations on such shapes are considered and within the scope of this disclosure.

Figure 8:
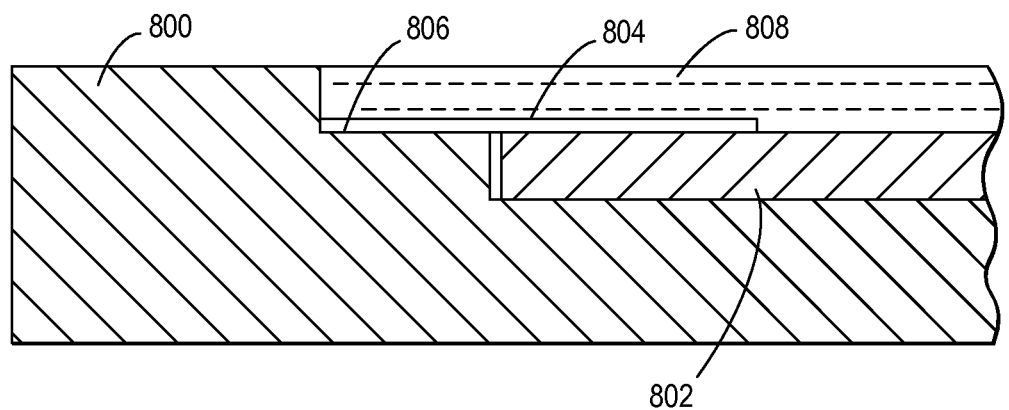
FIG. 8 illustrates an enlarged sectional view of another adhesive pool to create an adhesive preform unit.

FIG. 8 further illustrates another method of creating a shaped preform. Similar to FIGS. 6 and 7, an overlay 802 may be positioned in an adhesive pool 800. Masking 804 may extend over the overlay and over the bottom edge of level 1, at 806. Bonding liquid 808 may be dispensed on top of the overlay to form an adhesive preform unit. The additional masking may provide easier release of the overlay and preform from the adhesive pool such that there is minimized disruption to the shaped preform upon release.

Figure 9:
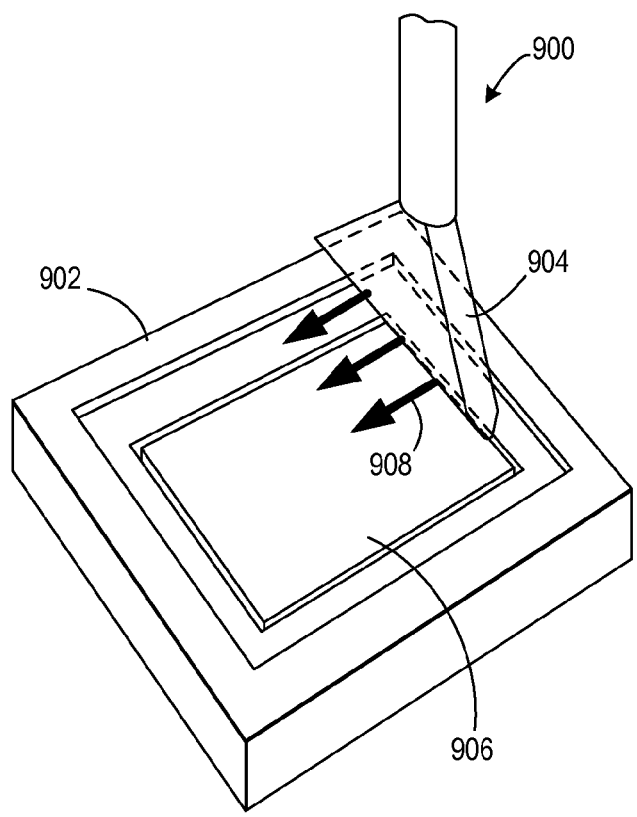
FIG. 9 illustrates a method for injecting the optical bonding liquid into the adhesive pool.

After positioning the overlay into the adhesive pool, the bonding material may be applied on top of the overlay. FIG. 9 shows a dispenser 900 for injecting bonding material into an adhesive pool 902. As shown, the dispenser 900 may include a paddle-tipped head 904 to ensure an even injection of bonding material across the overlay 906. The paddle-tipped head 904 may release the bonding material at a controlled rate as it is moved across the overlay as indicated by arrow 908. The bonding material may be selectively released such that it is deposited into the adhesive pool where it is substantially level with the top surface of the pool. The pool may be sized such that the pool depth corresponds to the depth of the desired bond-line thickness. In some embodiments, the bonding material may be injected into the pool evenly with exactly the proper amount of bonding material to completely fill, but not overfill the pool. In some embodiments, the low viscosity of the bonding material will allow it to self level and flow a short distance to fill out the form. Filling the pool results in creation of a preform with the desired bond-line thickness.

Although a single dispenser is illustrated, it should be appreciated that for mass production, multiple dispensers can be used to dispense an even line of bonding material across a series of adhesive pools.

Figure 10:
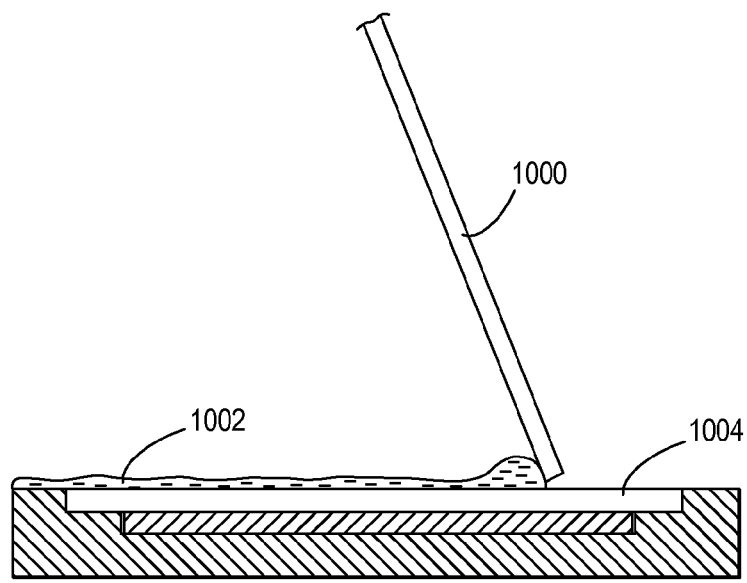
FIG. 10 illustrates a method for leveling the optical bonding liquid in the adhesive pool.

Although not necessary in all embodiments, it is noted that the surface of the bonding material may be further leveled using an edger or squeegee 1000 as illustrated in FIG. 10. In such embodiments, excess adhesive 1002 that has been injected into pool, may be removed by drawing the edger across the top surface, evenly filling the pool 1004 and moving the excess material out beyond the edge. In some embodiments, it may take two or three passes with an edger to remove sufficient adhesive to result in the correct thickness. It should be noted that in some embodiments, the dispenser and edger may be a single unit, such that use of the combination dispenser and edger results in injection of bonding material to form a level bond-line thickness over the overlay.

After injection and leveling of the bonding material, the bonding material is cured. Any suitable method for curing the bonding material may be used. It is noted that the bonding material may be fully cured in the adhesive pool or it may be removed with the overlay from the adhesive pool and then fully cured.

Figure 12:
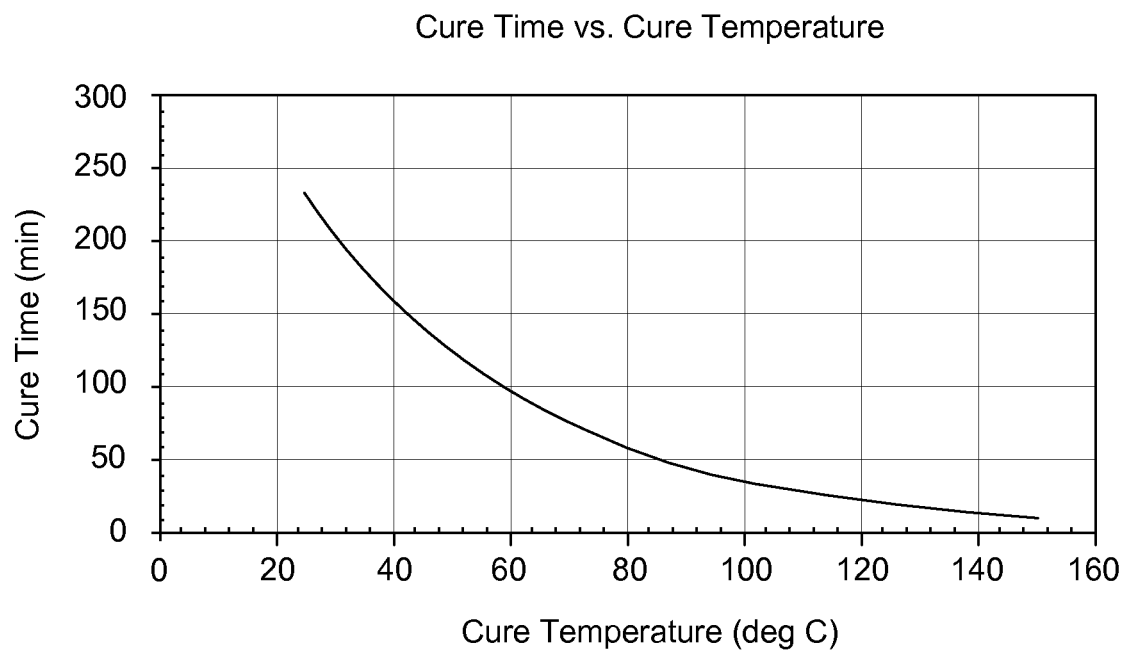
FIG. 12 shows a graphical representation of a variation of cure time as a function of cure temperature for the adhesive preform unit.

In an example embodiment using 2-part platinum cured silicone adhesives as the bonding material, the formulations are self curing. The adhesives may be cured at room temperature in 4 hours and can be accelerated to 2 hours at 50° C. When the adhesives are applied to a substrate, such as a glass overlay, much higher temperatures can be used without damaging the substrate. For example, at 150° C., the adhesive fully cures in 10 minutes, and as little as 3 minutes at 200° C. FIG. 12 shows a graphical representation of a variation of cure time as a function of cure temperature. The use of the overlay as the substrate enables the use of high cure temperatures. For example, temperatures of over 100° C. may reduce the cure time to less than one hour. The substrate, where the substrate is the overlay, such as a glass overlay, is not affected by the use of such high temperatures. In contrast, use of such high temperatures on the LCD would negatively effect operation of the LCD and would result in possible failure of the completed system.

In some embodiments, the curing may be accelerated using IR heaters or other suitable heating system. In one embodiment using silicone adhesives as the bonding material, since the silicone is transparent to IR wavelengths, the IR energy is transmitted through the silicone and is adsorbed by the substrate. The adhesive is heated uniformly from below (from the heated substrate) and is quickly cured in a very controlled manner. In another embodiment, a contact heating approach is utilized where the substrate (the overlay) is in contact with a hot plate where the temperature can be accurately controlled. A full cure in less than 3 minutes is possible when a silicone adhesive is applied to a 200° C. substrate. In still another example embodiment, a conventional convection oven can be used using hot air to heat the adhesive.

Another embodiment provides a two-stage system, where the bonding material is applied to the substrate and then a pre-heated nickel Teflon coated aluminum plug is applied from the top of the bonding material. The distance from the top of the bonding material to the top of the overlay can be controlled, enabling control over the bond line thickness and the quality of the top surface of the adhesive pre-form through shaping of the plug.

Figure 11:
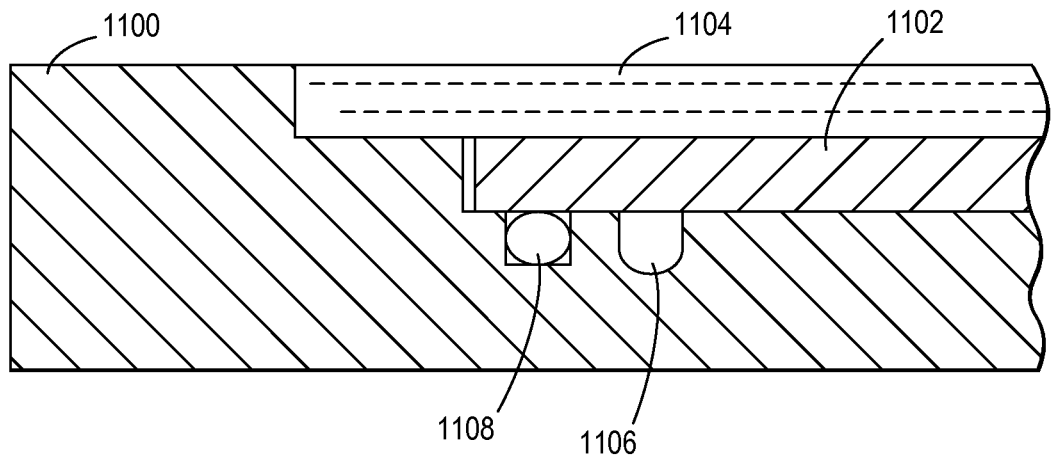
FIG. 11 illustrates an enlarged sectional view of an example system for removing the adhesive preform unit from the adhesive pool.

An example system for removing the overlay with the adhesive preform from the adhesive pool is illustrated in FIG. 11. As shown, overlay 1102 is positioned in adhesive pool 1100. Bonding material 1104 has been injected into adhesive pool 1100 such that the overlay 1102 and bonding material 1104 form an adhesive preform unit, also referred to as an adhesive preform overlay unit. In some adhesive pools, vacuum channels 1106 and seals 1108 may be used to retain the adhesive preform unit in the adhesive pool and minimize leakage during use of a vacuum.

Release of the adhesive preform unit may be assisted by use of easy-release materials. Clean, non-contaminated materials for the adhesive pool may prevent unwanted sticking of the bonding material to the adhesive pool. Further, coating of the adhesive pool may increase and ease debonding. For example, the adhesive pool may be coated in nickel-PTFE.

Figure 13:
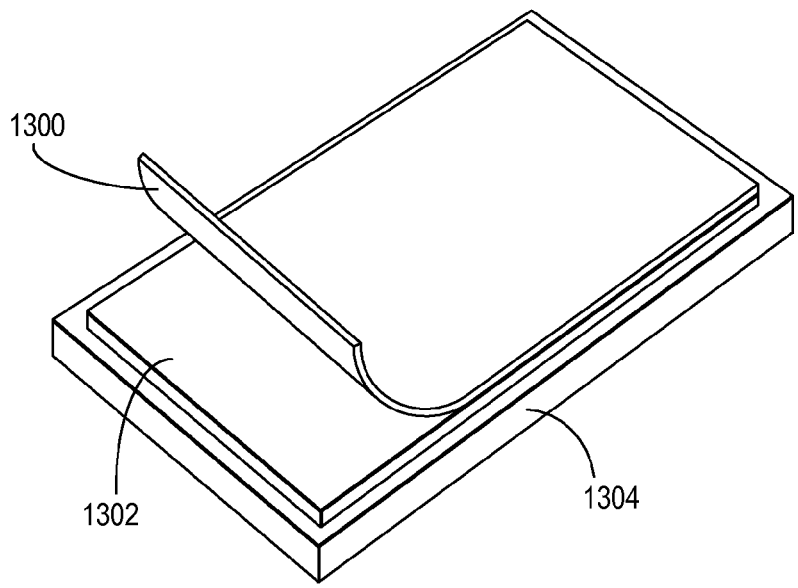
FIG. 13 illustrates a release liner for the adhesive preform unit.

In some embodiments, a release liner may be applied to the surface of the bonding material. FIG. 13 illustrates a release liner 1300 protecting the external surface of the adhesive preform 1302 where the adhesive preform is coupled to the overlay substrate 1304. The release liner may enable contact with the surface of the bonding material without contamination of the fragile optical surface. Contact with an uncovered top surface of the bonding material may result in contamination and marring of the surface. Further, it is noted that in some embodiments the over-sized preform can be used to release the adhesive preform unit from the adhesive pool. Although the extended edge of the over-sized preform is thin and fragile, the combination of easy-release materials and the use of the liner may assist in release of the adhesive preform unit from the adhesive pool. The release liner may also advantageously protect the pre-form from contamination and damage. As an example, for silicone adhesives, release liners may be materials such as low density polyethylene (LDPE). To be effective, the liner must be substantially free from contaminants and particulates.

In addition to the above, to assist in pulling the adhesive preform unit from the adhesive pool, vacuum channels 1106 can be used to grip and subsequently release the adhesive preform unit. As shown, these vacuum channels may be built into the adhesive pool.

Although described above in regards to creating individual adhesive preform units, it is also possible to generate a grouped set of adhesive preform units. As such, in some embodiments, multiple adhesive pools may be aligned such that a plurality of overlays may be processed together. In such an embodiment, a fluid dispenser may be used having multiple heads or other arrangement where the fluid dispenser may releases adhesive into multiple adhesive pools simultaneously or successively.

Figure 14:
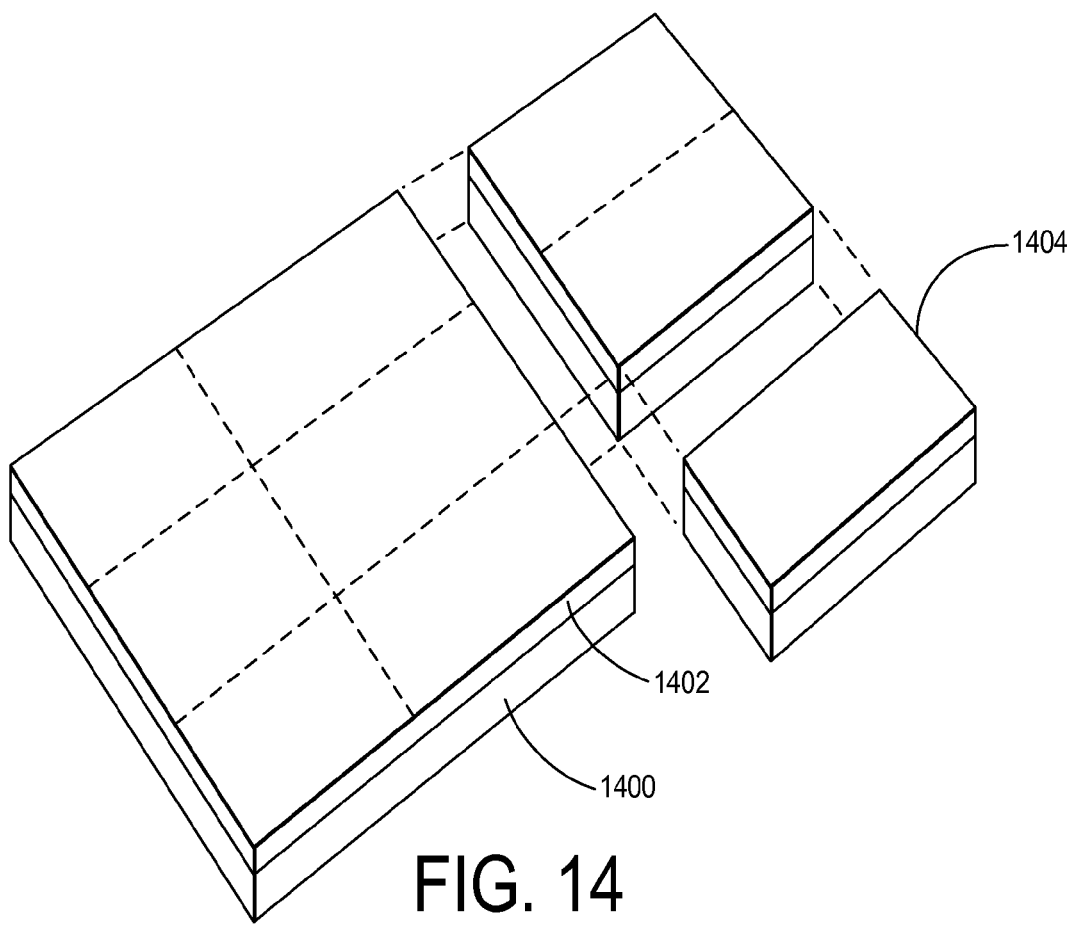
FIG. 14 illustrates a method utilizing a sheet of mother glass as the substrate and singulating the sheet to for individual adhesive preform units.

The adhesive preform units may be selectively cut to generate individual units. The use of a grouped set increases manufacturing efficiency as it may be possible to generate a significant number of individual units using a single substrate platform. A release liner may be applied to the exposed adhesive on the adhesive preform unit to protect the adhesive and prevent contamination until the adhesive preform unit is laminated to a display FIG. 14 shows an embodiment where a sheet of mother glass 1400 is treated as the substrate. An adhesive 1402 may be applied to the sheet 1400 to form an adhesive preform unit which can be singulated for individual displays 1404. In some embodiments, the sheet 1400 may be scribed before application of the adhesive to allow any debris generated by the scribing process to be cleaned prior to coating. Once coated and cured, sheet 1400 can be broken along the previously scribed lines and singulated. In other embodiments, sheet 1400 may be scribed and broken after the adhesive has been applied and cured. For example, the sheet may be scribed using laser scribing or other process that minimizes generation of debris.

In some embodiments, the singulated units may have raw edges that are seamed to remove sharp features. Further, such edge seaming may improve mechanical performance by reducing crack initiators.

It is noted that the sheets may be preprinted or preprocessed prior to application of the adhesive to create specialty overlays. As an example, preprinting may be used for masking, for aesthetic applications. As a further example, a preprocessed sheet may have holes or other features included in the glass. Further, in some embodiments, sensors, such as touch sensors may be incorporated onto the overlay sheet. After the adhesive is applied to the sheet and cured, the sheet may be singulated to yield individual overlays with the specialty features in the desired position.

As described above in regards to the individual adhesive preform units, a release liner, such as low density polyethylene (LDPE), may also be added to the coated mother glass to allow for storage and shipment prior to singulation. The adhesive pre-forms can also have the release liner added after the mother glass is singulated.

Regardless of the method used to develop an adhesive preform unit (an overlay with a cured adhesive preform), such adhesive preform unit is configured to be laminated to a display to form an enhanced layered display system. Thus, after being fully cured, individual adhesive preform units may be laminated to the corresponding display as described in more detail below. If a release liner is present, it is first removed and then the adhesive on the overlay is then brought in contact with the clean, top polarizer on the display. Pressure may be added over time to the bond to assure a good tack.

Figure 15:
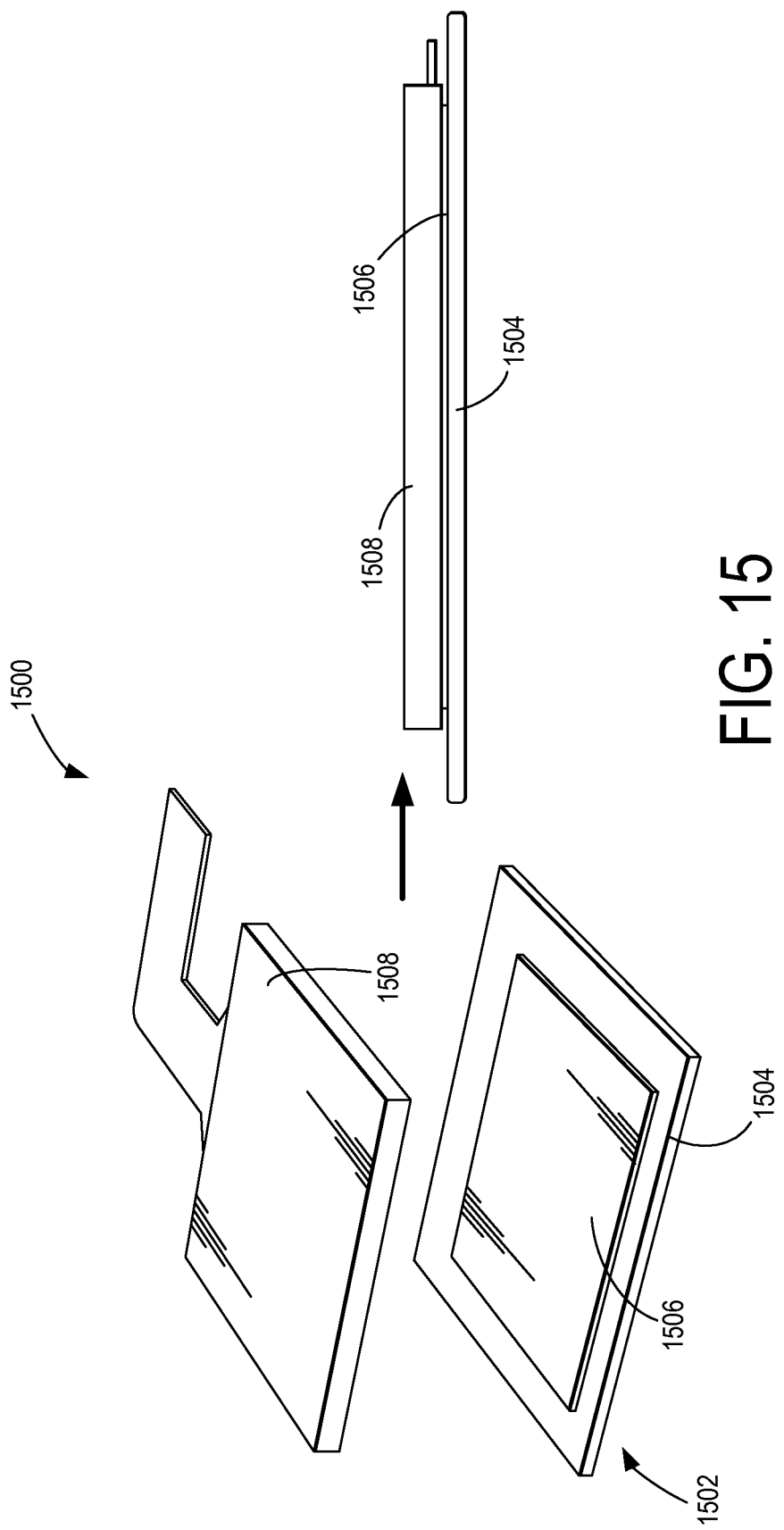
FIG. 15 illustrates a method of coupling an adhesive preform unit to a display.

FIG. 15 illustrates at 1500 coupling of an adhesive preform unit 1502 to a display 1508. Adhesive preform unit 1502 includes an overlay substrate 1504 and an adhesive preform 1506. It is noted that the adhesive preform is a shaped preform where the overlay includes an in-bezel bond. It should be appreciated that the preform may be configured, such as a shaped or edge-to-edge preform, depending on the dimensions and desired aesthetic appearance of the resulting layered display system.

A dedicated alignment fixture may be used to properly position the overlay with respect to the display to assure proper positional alignment within tight tolerances. Such fixturing systems have shown to be accurate to within +/−0.02 mm in volume production. Alternately, a robotic or semi-robotic system may be used to perform the lamination. In this case, dedicated fixturing may not be necessary for each specific part geometry as the robotic system may incorporate an active alignment or positional system to accurately determine the position and orientation of the overlay and the display and compensate to properly align the assembly.

Figure 16:
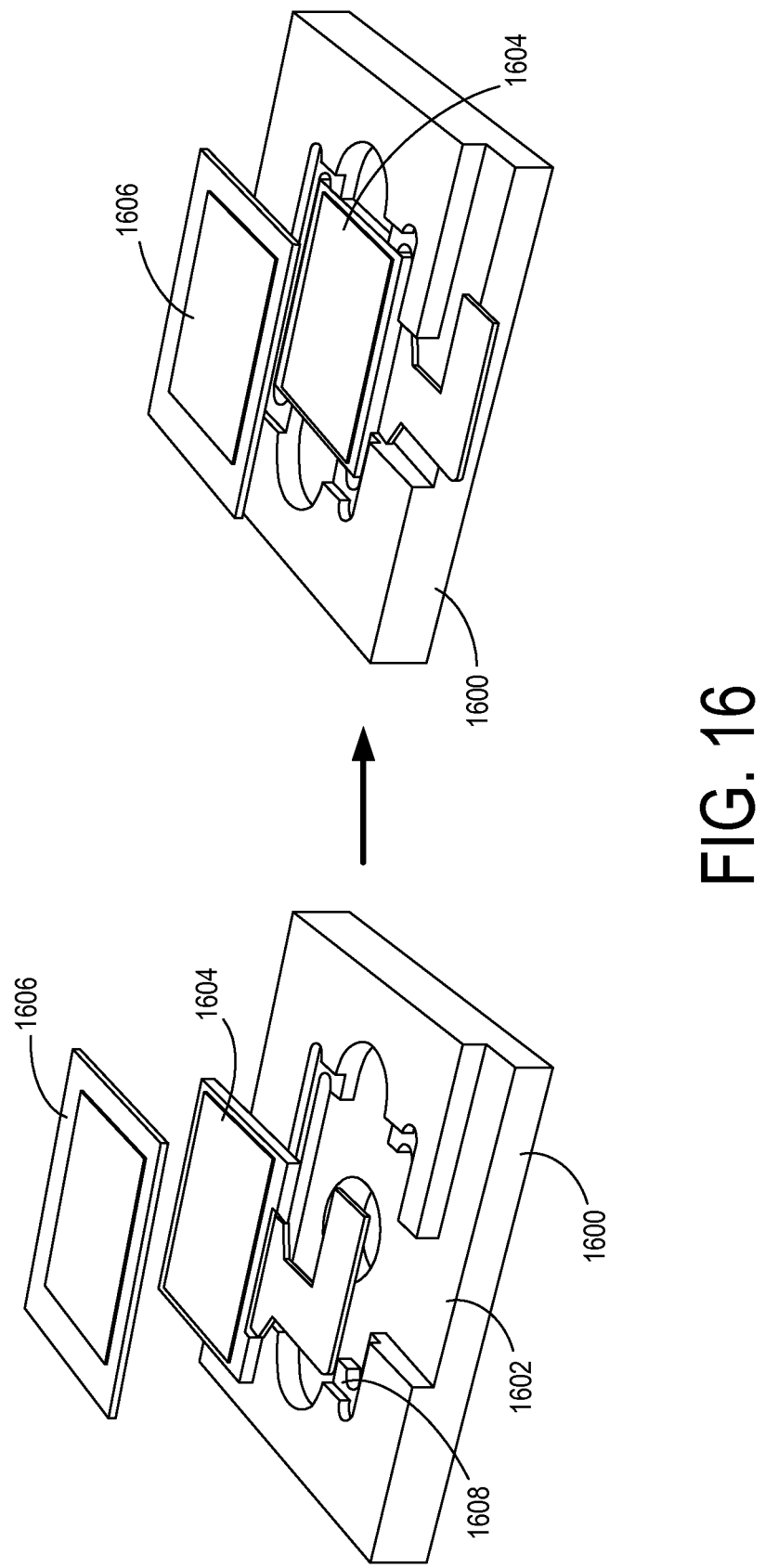
FIG. 16 illustrates an example alignment fixture for coupling an adhesive preform unit to a display.

FIG. 16 illustrates an example alignment fixture 1600. Alignment fixture 1602 includes a display receiver 1602 for display 1604. The adhesive preform unit 1606 may be positioned in channel 1608 such that the overlay and display are properly aligned. It should be appreciated that the alignment fixture may have receivers of various shapes to correspond to the dimensions of the display and the overlay.

Since the adhesive in the adhesive preform unit has already fully cured, the bond between the overlay and the display is made and the parts held together instantly upon contact. In contrast to prior systems, there is no need to wait while the adhesive cross links. The immediate bonding reduces the number of alignment fixtures or robotic alignment and lamination stations needed, decreasing equipment investment and, resulting in increased production efficiency.

In some embodiments, the adhesive preform unit is deformed slightly prior to laminating. For example, with small systems, the adhesive preform unit can be deformed into a section of a cylinder. In this way, lamination begins as a line contact, and then the adhesive preform unit is rolled onto the display, keeping a continuous advance of the bonded area and substantially eliminating any trapped air pockets. For larger systems, the adhesive preform unit can be deformed into a section of a sphere by fixing the corners and pushing the center towards the display. Lamination is initiated at a point in the center of the display and the bonded area then spreads from there as the amount of deflection in the adhesive preform unit is decreased. Again, with such embodiments, the air bubbles are minimized during the lamination process improving the quality of the laminated system.

In some embodiments, the lamination process is completed in a vacuum environment. The vacuum environment may substantially reduce or eliminate air bubbles that get trapped during the lamination process. As described in more detail below, in such embodiments, the adhesive preform unit and display are placed within the vacuum chamber, which is evacuated. Once the pressure in the chamber reaches the desired level, the adhesive preform unit may be brought in contact with the top polarizer on the display.

Following lamination of the overlay to the display, in some embodiments, the enhanced layered display system is post-processed to eliminate any air entrapped during the lamination process. For example, during lamination at standard atmospheric pressure, the coupling of the adhesive preform unit to the display may result in the capture of small amounts of air between the overlay and the display, e.g. the LCD glass. The air bubbles create optically visible flaws which affect the quality of the system. In one system, the enhanced layered display system is placed under pressure and elevated temperature. For example, the enhanced layered display systems may be heat and pressure processed. For example, some systems may be post-processed at 0.5 MPa (72.5 psi) and 50° C. for 20 minutes. In another example, the enhanced layered display systems are post processed under pressure only, e.g. with 0.41 MPa (60 psi) pressure for as little 10 minutes. The optimal processing schedule may vary depending on different display size and bond thickness combinations. For example, the systems may be post processed using a combination of heat and pressure for periods varying from ten to sixty minutes depending on the intensity of the heat and pressure. As another example, in one embodiment, the post-processing procedure use a heated autoclave which uses pressures in excess of 0.5 Mpa and temperatures approximately 45° C. for up to forty five minutes to drive the bubbles out from between the display and the overlay and produce a fully-cured, optically clear bond. After post-processing, the bonds may be examined or tested for flaws, optical quality or other performance issues.

The adhesive and cohesive strength of the optical bond does not change significantly during post processing, but any air bubbles can be substantially eliminated. It further should be appreciated that the post-processing may be eliminated or reduced for systems which have little or no bubble formation during lamination, such as the vacuum lamination process described in more detail below.

As briefly mentioned above, in some embodiments, the adhesive preform unit may be laminated to the display in a vacuum environment. Laminating the adhesive preform unit and the display in a vacuum may eliminate any residual bubbles, and negate the requirement for post processing the laminated assembly with heat and pressure, allowing the finished product to be inspected and packaged immediately after the lamination process. As one example, the lamination process may be a 30 second process and packaging may occur immediately after the lamination process. Such a system may result in a total work in process inventory time reduction of over forty-five minutes (where the post processing system requires both heat and pressure processing), to less than one minute with the vacuum lamination. Further, and the elimination of post processing provides a more direct lean production system. Such advantages lead to the ability to produce a high volume of display systems and reduce costs on production of such systems.

Figure 17:
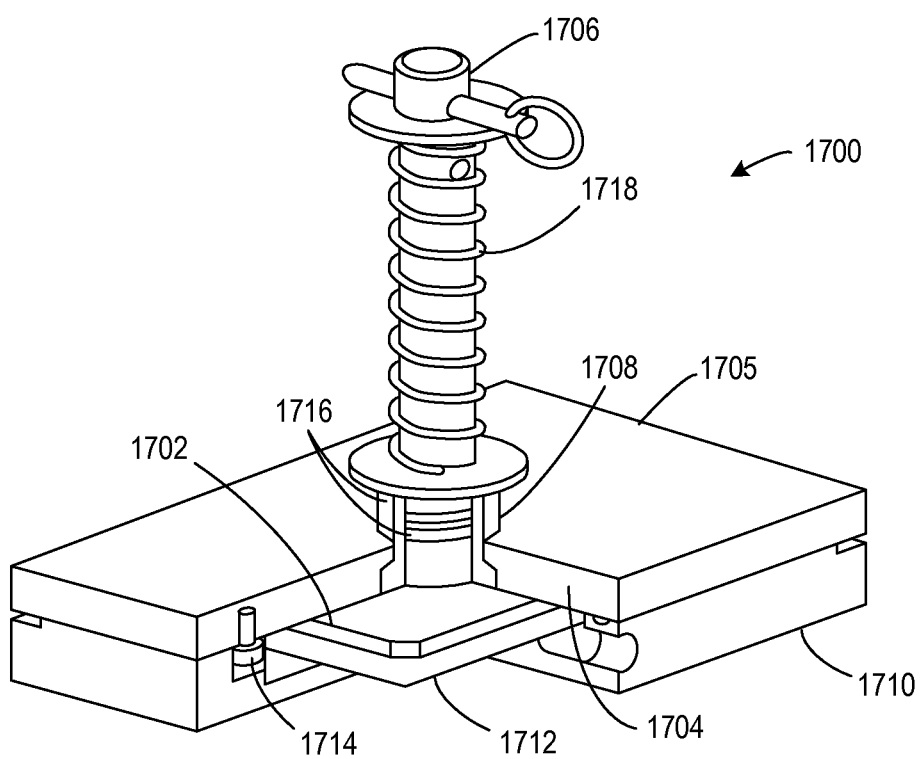
FIG. 17 shows a cut-away view of an example system for providing a vacuum environment for coupling an adhesive preform unit to a display.

In one example embodiment, as illustrated in FIG. 17, the adhesive preform unit 1702 is loaded onto a holder 1704 in the upper housing 1705 of vacuum laminator 1700. Holder 1704 is mounted on a piston 1706 positioned in a sealed cylinder 1708. Cylinder 1708 may be permanently mounted in the upper housing of the vacuum chamber.

Positioned below the upper housing, in the lower half of the vacuum chamber (lower housing 1710) is display 1712. Locating pins, such as pin 1714, may be used to align the upper and lower houses of the chamber. One or more perimeter compliant members, such as rings 1716, may form a seal, and a vacuum is pulled through a hole in the chamber. The spring 1718 on the piston prevents the vacuum from pulling the piston down. Washers 1720 are further illustrated in FIG. 17.

In an example embodiment, once a vacuum of 30 mm of Hg has been achieved, a vacuum pump, such as piston 1706, may be engaged, such as by pressing the piston down by either hand or machine force. As a result, the adhesive preform unit 1702 and display 1712 may be coupled. Following coupling, the vacuum is released, standard pressure achieved and the chamber opened to remove the enhanced layered display system, now laminated and substantially bubble free. Typically, with the use of the vacuum lamination, no post processing is needed to complete the bond.

Figure 18:
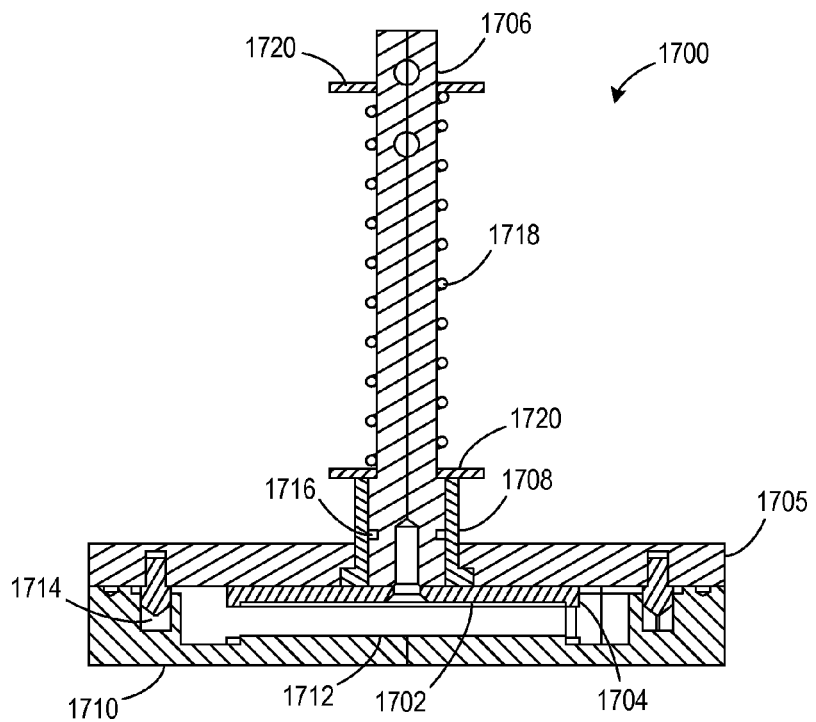
FIG. 18 shows a sectional view of the example system of FIG. 17 for providing a vacuum environment for coupling an adhesive preform unit to a display where the adhesive preform unit and display are aligned but not yet in contact.
Figure 19:
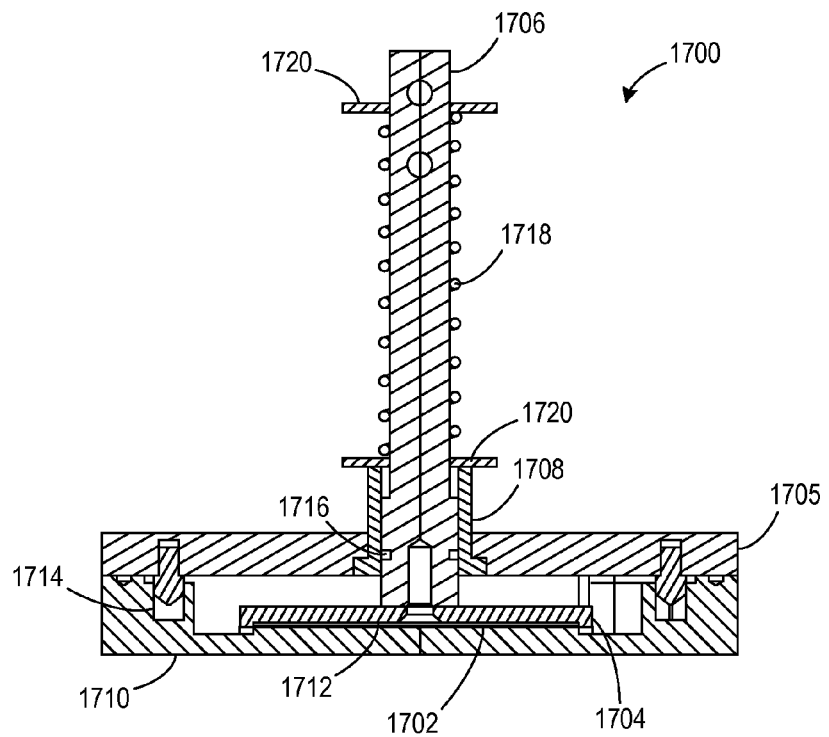
FIG. 19 shows a sectional view of the example system of FIG. 17 for providing a vacuum environment for coupling an adhesive preform unit to a display where the adhesive preform unit and display are in contact.

FIG. 17 illustrates the vacuum laminator 1700 in a position ready for bonding. As described above, adhesive preform unit 1702 and display 1714 are positioned in the upper and lower housing respectively such that upon contact the overlay and display are in the desired alignment. FIG. 18 shows a sectional view of the vacuum laminator 1700 with the piston in position prior to bonding adhesive preform unit 1702 and display 1714. FIG. 19 shows another sectional view of the vacuum laminator 1700, where the piston 1706 has been moved to bond adhesive preform unit 1702 and display 1712 together.

Figure 20:
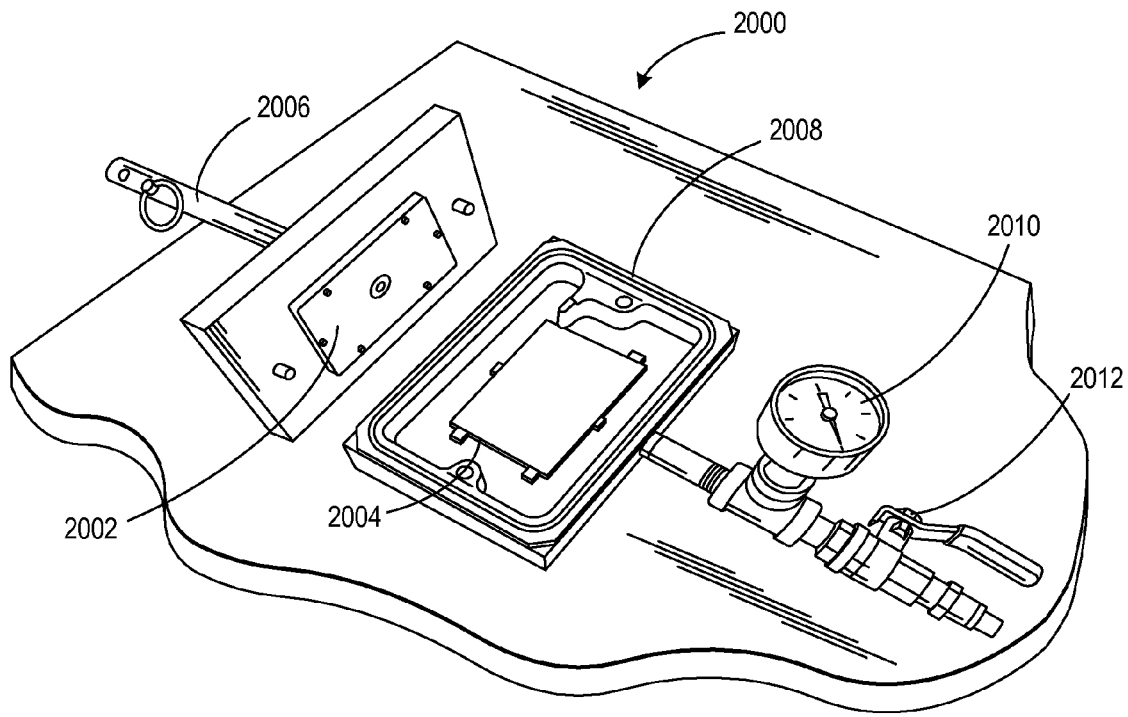
FIG. 20 shows an example vacuum laminator for coupling an adhesive preform unit to a display.
Figure 21:
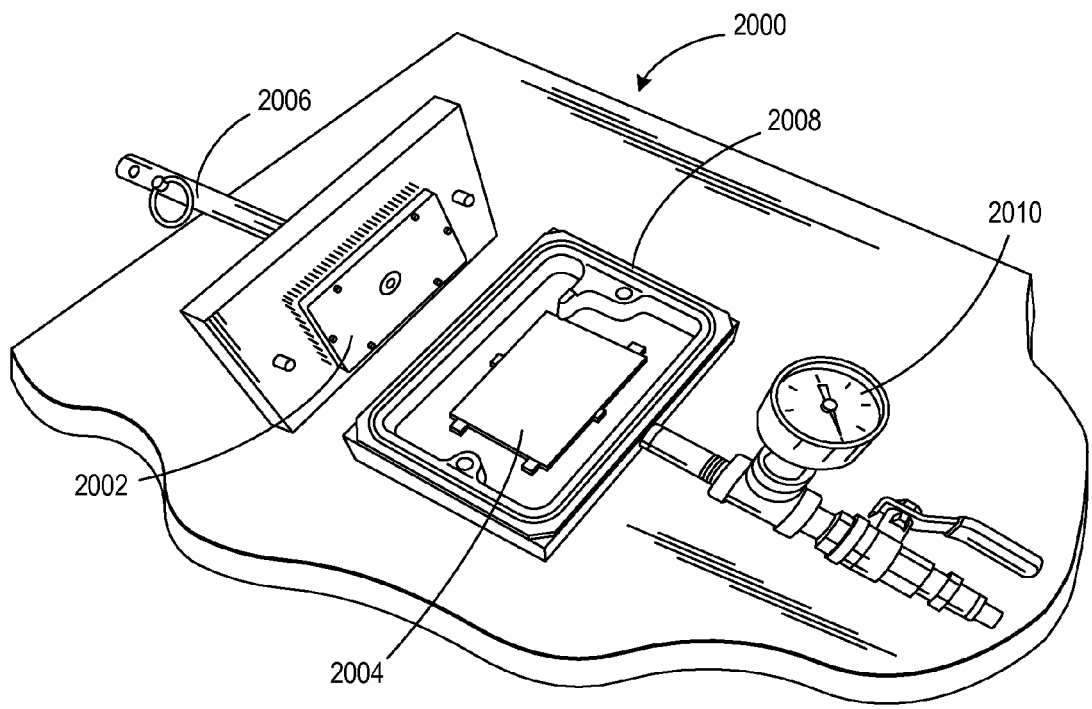
FIG. 21 shows the example vacuum laminator of FIG. 20 for coupling an adhesive preform unit to a display where the piston has been extended for making the bond between the adhesive preform unit and a display.

FIGS. 20 and 21 illustrate another embodiment of a vacuum laminator. In this embodiment, the vacuum laminator 2000 is shown in an open position ready for loading of an adhesive preform unit into the upper housing 2002 and loading of a display into the lower housing 2004. FIG. 20 shows piston 2006 retracted for loading and for pulling a vacuum. FIG. 21 shows piston 2006 extended for making the bond between the adhesive preform unit and display. It is noted that a seal 2008 on lower housing 2004 is provided to prevent leaks in the housing. Further illustrated in FIGS. 20 and 21 is a gauge 2010 for measuring the vacuum in the chamber and a shut-off valve 2012 for shutting off the chamber from the vacuum source.

Figure 22:
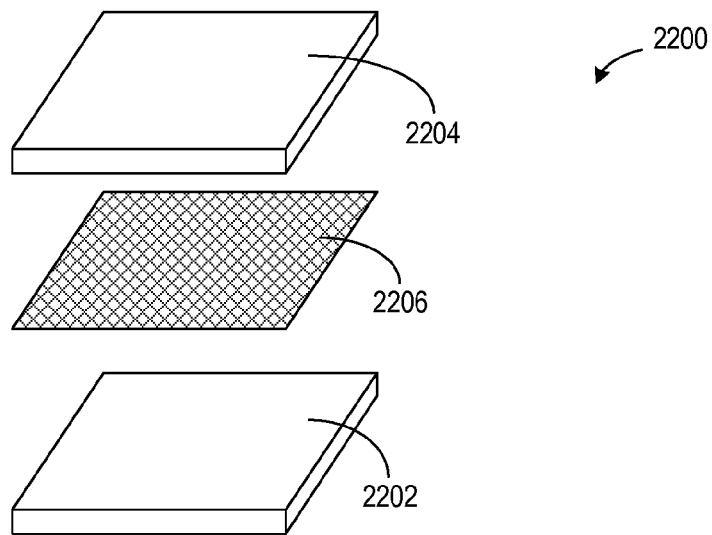
FIG. 22 illustrates another process for providing an optical layer for a display system according to an embodiment of the present disclosure FIG. 23 provides a further example of a process for providing an optical layer for a display system according to an embodiment of the present disclosure.

FIG. 22 provides another embodiment of a layered display. Layered display 2200 may include a first substrate 2202 and a second substrate 2204. An optical bonding layer 2206 may be disposed between first substrate 2202 and second substrate 2204. Optical bonding layer 2206 may be an adhesive, such as a pressure sensitive adhesive sheet or a fully cured transfer adhesive, such as the adhesive described above. The adhesive sheet may have an index of refraction designed to minimize reflections from the first and second substrates.

The bonding layer may be of substantial thickness to accommodate, in part, extended topographies and allow a defect free layer in the first and second substrate. Thus, in some embodiments, the bonding layer, such as the bonding layers described above, may be approximately 0.010 inch (0.25 mm) thick.

In one example embodiment, an optical adhesive, such as a two-part platinum cured silicone adhesive, may be cast directly onto a release liner, such as an LDPE release liner. The adhesive may then be cured and a second release liner positioned on the previously exposed surface. This transfer adhesive can then be stored and shipped as a sheet. When ready to bond, one release liner may be removed and the transfer adhesive may be laminated to the overlay or display. Similarly, the second release liner may be removed and the display or overlay is then laminated in place. Depending on the lamination method, the bond can be post-processed to remove any trapped air.

The transfer adhesive sheet may enable the adhesive processing to be separated physically and geographically from the laminating process. Moreover, the transfer adhesive sheet may be selectively cut to the desired size easily for late stage differentiation in the production cycle allowing significant variation in products. Finally, the adhesive can be made in large sheets (or even roll to roll).

It is noted that similar methods as described above may be used to generate a select bond-line thickness on the release liner. For example, the transfer adhesive may be made in fixed size tools or forms. Further, in some embodiments, roll-to-roll methods where the adhesive is extruded onto a roll of release liner and cured, and then the second liner is rolled onto the previously exposed surface may be used.

Figure 23:
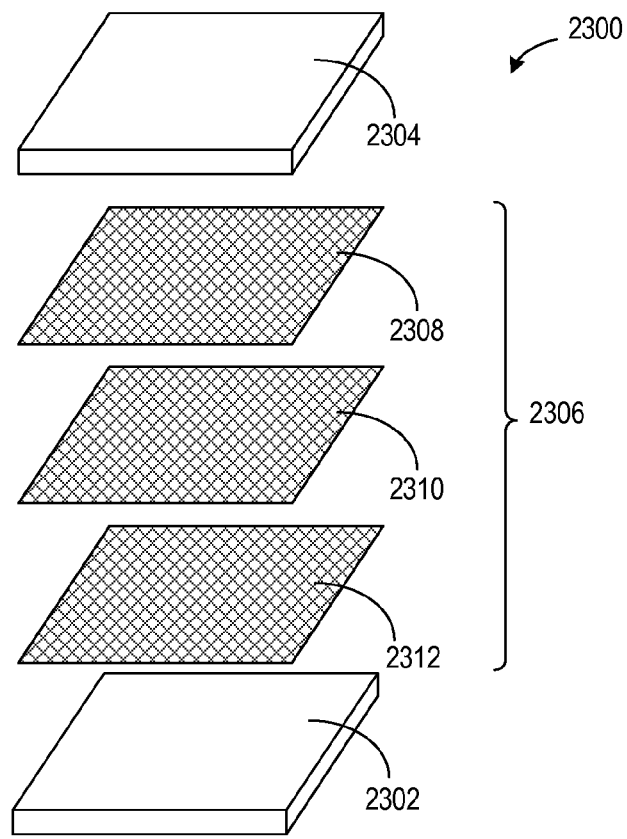

Similarly, FIG. 23 provides another embodiment of a layered display according to an embodiment of the present disclosure. Layered display 2300 includes a first substrate 2302 and a second substrate 2304. Disposed between first substrate 2302 and second substrate 2304 is a bonding layer 2306. Bonding layer 2306 may include a plurality of adhesive sheets 2308, 2310, 2312, such as pressure sensitive adhesive sheets or transfer adhesive sheets. The sheets may be stacked to form an optical enhancement layer. Each sheet may have a suitable index of refraction that it that is designed to reduce the reflections from the first and second substrates.

Although three sheets are illustrated, it should be appreciated that any number of sheets may make up bonding layer 2306. Further, the sheets may be made of the same material or of different material. For example, some sheets may be a urethane-derivative, while others may be a silicone derivative or acrylic-derivative. Moreover, the sheets may be of the same or different thickness.

As described above, bonding layer 2306 may be of substantial thickness to accommodate extended topographies in the first and second substrate. Thus, in some embodiments, the bonding layer may be approximately 0.010 inch (0.25 mm) thick. As the bonding layer may be composed of multiple sheets, each sheet may be of such thickness that the total bonding layer is approximately 0.010 inch (0.25 mm).

It is noted that in some embodiments, bonding layers 2308, 2310, or 2312 may be comprised of one or more non-adhesive optical enhancement layers. These layers may be pressed or trapped between the two substrates and may be used alone or in combination with an adhesive. For example, in some embodiments, the bonding material may be a non-adhesive optical enhancement layer which may be sandwiched between the first and second substrate and retained through clamps or frames. The index of refraction of the layers are designed to provide optical enhancement for the display, but provide little or no adhesion qualities.

In some embodiments, the display may further include a bezel. In such embodiments, multiple applications may be necessary to provide sufficient bonding layers. For example, two applications may be used, one on the display and one on the bezel. Combination bonding materials may be used with such systems.

Figure 24:
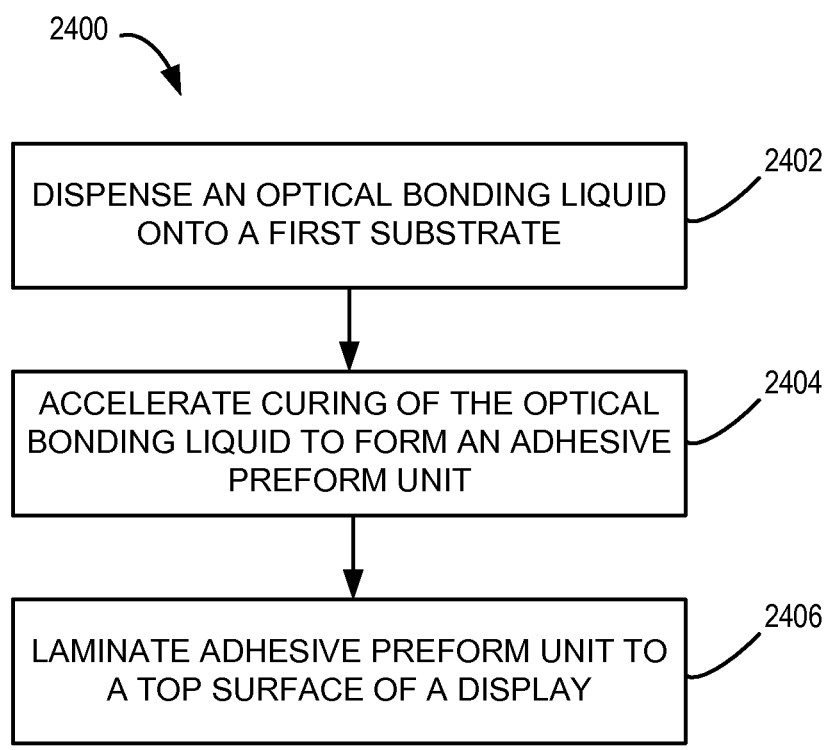
FIG. 24 shows a process flow depicting a method of generating an enhanced layered display system.

Continuing with the figures, FIG. 24 shows a process flow depicting an embodiment of a method of generating an enhanced layered display system. Method 2400 comprises, at 2402, dispensing an optical bonding liquid onto a first substrate; accelerating curing, at 2404, of the optical bonding liquid to form an adhesive preform unit; and laminating, at 206, the adhesive preform unit to a top surface of a liquid crystal display to form the enhanced layered display system. It is noted that the dispensing of an optical bonding liquid onto a first substrate and the curing to form an adhesive preform unit may be performed in a first location and the laminating step performed in a second location. Further, it should be appreciated that the adhesive preform unit may be transported for lamination and processing in a different facility at a subsequent period of time. If the adhesive preform unit is generated for later use, a release liner may be used to prevent contamination of the adhesive preform.

It will be understood that the configurations and/or approaches described herein are exemplary in nature, and that these specific embodiments or examples are not to be considered in a limiting sense, because numerous variations are possible. The subject matter of the present disclosure includes all novel and nonobvious combinations and subcombinations of the various processes, systems and configurations, and other features, functions, acts, and/or properties disclosed herein, as well as any and all equivalents thereof.

The invention claimed is:

1. A method of generating an enhanced layered display system, comprising:
dispensing a layer of an optical bonding liquid having optical properties onto a first substrate to form a bonding layer, where the first substrate is a glass or plastic overlay;
forming an adhesive preform unit by curing the optical bonding liquid on the first substrate where the adhesive preform unit comprises a shaped preform, where the shaped preform corresponds to a shape of a top surface of a display;
where the curing of the optical bonding liquid to form the adhesive preform unit occurs prior to introduction of the display;
laminating the adhesive preform unit to the display to form the enhanced layered display system;
wherein laminating the adhesive preform unit to the display includes laminating in a vacuum environment; and
where the first substrate is a protective overlay for the display;
positioning the first substrate in an adhesive pool;
filling the adhesive pool to a select level to create a uniform bond line thickness across the first substrate, wherein the optical bonding liquid is extended beyond a perimeter of the first substrate to create an excess preform perimeter;
curing the optical bonding liquid; and
cleaning the excess preform perimeter from the first substrate after curing the optical bonding liquid.

2. The method of claim 1, wherein the optical bonding liquid includes an adhesive, the adhesive index-matched to at least one of the first substrate or the display.

3. The method of claim 2, wherein the adhesive includes a two-part silicone adhesive.

4. The method of claim 1, wherein forming the adhesive preform unit comprises leveling the optical bonding liquid on the first substrate by drawing an edger across a top surface of the optical bonding liquid.

5. The method of claim 1, wherein forming the adhesive preform unit comprises thermally curing the optical bonding liquid at a temperature of at least 150° C.

6. The method of claim 1, wherein the vacuum environment comprises creating a vacuum of at least 30 mm of Hg.

7. A method of generating an enhanced layered display system, comprising:
forming an adhesive preform unit on an overlay, forming the adhesive preform unit comprising:
positioning a first substrate in an adhesive pool,
thereafter filling the adhesive pool with an optical bonding liquid having optical properties to a select level to create a uniform bond line thickness across the first substrate, and
thermally curing the optical bonding liquid to form a bonding layer with a uniform surface;
thereafter placing the adhesive preform unit in a vacuum chamber;
placing a display unit in the vacuum chamber;
evacuating the vacuum chamber; and
bringing the adhesive preform unit in contact with the display unit to form the enhanced layered display system, once a vacuum has been achieved.

8. The method of claim 7, wherein forming the adhesive preform unit comprises thermally curing the optical bonding liquid at a temperature of at least 150° C., and wherein evacuating the vacuum chamber comprises creating a vacuum of at least 30 mm of Hg deforming the adhesive preform unit.

9. The method of claim 7, wherein the adhesive pool has a depth corresponding to a depth of the bond line thickness.

10. The method according to claim 7, wherein the optical bonding liquid is fully cured in the adhesive pool.

* * * * *